(12) United States Patent
Monbouquette et al.

(10) Patent No.: US 7,524,408 B2
(45) Date of Patent: Apr. 28, 2009

(54) SURFACE NANOPATTERNING

(75) Inventors: Harold G. Monbouquette, Santa Montica, CA (US); Miguel Garcia-Garibay, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 902 days.

(21) Appl. No.: 11/029,303

(22) Filed: Jan. 5, 2005

(65) Prior Publication Data

US 2006/0068090 A1    Mar. 30, 2006

Related U.S. Application Data

(63) Continuation of application No. PCT/US03/21496, filed on Jul. 8, 2003.

(60) Provisional application No. 60/394,701, filed on Jul. 8, 2002.

(51) Int. Cl.
*C25D 13/12* (2006.01)
(52) U.S. Cl. .................. 204/486; 204/157.15
(58) Field of Classification Search .............. 204/486, 204/157.15
See application file for complete search history.

(56) References Cited

U.S. PATENT DOCUMENTS 4,303,486 A    12/1981    Bard et al.
6,290,839 B1    9/2001    Kayyem et al.

OTHER PUBLICATIONS

Alves, C.A.; Smith, E.L.; Porter, M.D. Atomic Scale Imaging of Alkanethiolate Monolayers at Gold Surfaces with Atomic Force Microscopy. J. Am. Chem. Soc. 1992, 114, 1222-1227.

Bansal, A.; Li, X.; Lauermann, I.; Lewis, N. S.; Yi, S.; Weinberg, W. H. Alkylation of Si Surfaces Using a Two-Step Halogenation/Grignard Route. J. Am. Chem. Soc. 1996, 118, 7225-7226.

Boukherroub, R.; Morin, S.; Benzebaa, F.; Wayner, D. D. M. New Synthetic Routes to Alkyl Monolayers on the Si(111) Surface. Langmuir 1999, 15, 3831-3835.

(Continued)

*Primary Examiner*—Kishor Mayekar
(74) *Attorney, Agent, or Firm*—John P. O'Banion

(57) ABSTRACT

A method for producing, and a product having, a surface nanopattern, wherein the method comprises the steps of: obtaining a substrate with a smooth surface; acquiring a self-assembling monolayer precursor, wherein the precursor includes an inducible, usually photocatalytically, active region and a substrate attachment region; mixing a plurality of the self-assembling monolayer precursors with the substrate to produce a self-assembled monolayer having an exposed surface comprising the inducible active regions and anchored to the substrate smooth surface by the substrate attachment regions; obtaining a path-directable nanoparticle; contacting the path-directable nanoparticle with the exposed surface at an interface area; exposing the exposed surface contacted with the path-directable nanoparticle to an inducing event, usually exposure to light, thereby chemically altering the inducible active regions and producing a detectable state in the interface area on the exposed surface; and applying a force of variable magnitude and direction in the plane of the surface to the contacted path-directable nanoparticle to produce movement of the contacted nanoparticle over the exposed surface thereby extending the detectable state interface area into a detectable trace over the exposed surface to produce the nanopatterened surface.

43 Claims, 15 Drawing Sheets

OTHER PUBLICATIONS

Boukherroub, R.; Wayner, D. D. M. Controlled Functionalization and Multistep Chemical Manipulation of Covalently Modified Si(111) Surfaces. J. Am. Chem. Soc. 1999, 121, 11513-11515.

Budac, D.; Wan, P. Photodecarboxylation—mechanism and synthetic utility. J. Photochem. Photobiol., A 1992, 67, 135-166.

Chen, J; Reed, M.A.; Rawlett, A.M.; Tour, J.M. Large On-Off Ratios and Negative Differential Resistance in a Molecular Electronic Device. Science 1999, 286, 1550-1552.

Chey, S.J.; Huang, L.; Weaver, J.H. Manipulation and writing with Ag nanocrystals on Si(111)-7×7. Appl. Phys. Lett. 1998, 72, 2698-2700.

Cicero, R. L.; Wagner, P.; Linford, M. R.; Hawker, C. J.; Waymouth, R. M.; Chidsey, C. E. D. Functionalization of Alkyl Monolayers on Surfaces with Diverse Amines: Photochemical Chlorosulfonation Followed by Sulfonamide Formation. Polym. Prepr. 1997, 38, 904-905.

Collier, C.P.; Wong, E.W.; Belohradsky, M.; Raymo, F.M.; Stoddart, J.F.; Kuekes, P.J.; Williams, R.S.; Heath, J.R. Electronically Configurable Molecular -Based Logic Gates. Science 1999, 285, 391-394.

Colvin, V.L.; Goldstein, A.N.; Alivisatos, A.P. Semiconductor Nanocrystals Covalently Bound to Metal Surfaces with Self-Assembled Monolayers. J. Am. Chem. Soc. 1992, 114, 5521-5230.

Cox, J.K.; Eisenberg, A.; Lennox, R.B. Patterned surfaces via self-assembly. Curr Opinion Coll. Interface Sci. 1999, 4, 52-59.

Eigler, D.M.; Schweitzer, E.K. Positioning single atoms with scanning tunnelling microscope. Nature 1990, 344, 524-526.

Ellenbogen, J.C.; Love, J.C. Architectures for molecular electronic computers: 1. Logic structures and an adder built from molecular electronic diodes. Proc. IEEE 2000, 88, 386-426.

Eychmüller, A.; Katsikas, L.; Weller, H. Photochemistry of Semiconductor Colloids. 35. Size Separation of Colloidal CdS by Gel Electrophoresis. Langmuir 1990, 6, 1605-1608.

Fadeev, A. Y.; McCarthy, T. J. Trialkylsilane Monolayers Covalently Attached to Silicon Surfaces: Wettability Studies Indicating that Molecular Topography Contributes to Contact Angle Histeresis. Langmuir 1999, 15, 3759-3766.

Fox, M.A. Fundamentals in the Design of Molecular Electronic Devices: Long-Range Charge Carrier Transport and Electronic Coupling. Acc. Chem. Res. 1999, 32, 201-207.

Goldhaber-Gordon, D.; Montemerlo, M.S.; Love, J.C.; Opiteck, G.J.; Ellenbogen, J.C. Overview of Nanoelectronic Devices. Proc. IEEE 1997, 85, 521-540.

Groves, J.T.; Wülfing, C.; Boxer, S.G. Electrical Manipulation of Glycan-Phosphatidyl Inositol-Tethered Proteins in Planar Supported Bilayers. Biophys. J., 1996, 71, 2716-2723.

Heath, J.R.; Kuekes, P.J.; Snider, G.S.; Williams, R.S. A Defect-Tolerant Computer Architecture: Opportunites for Nanotechnology. Science 1998, 280, 1716-1721.

Israelachvili, J. Intermolecular and Surface Forces, 2nd Ed. Academic Press: San Diego, 1992; pp. 50-54.

Johnson, K.S.; Thywissen, J.H.; Dekker, N.H.; Berggren, K.K.; Chu, A.P.; Younkin, R.; Prentiss, M. Localization of Metastable Atom Beams with Optical Standing Waves: Nanolithography at the Heisenberg Limit. Science 1998, 280, 1583-1586.

Katsikas, L.; Velickovic, J.S.; Weller, H.; Popovic, I.G. Thermogravimetric Characterisation of Poly(Methyl Methacrylate) Photopolymerised by Colloidal Cadmium Sulfide. J. Therm.Anal. 1997, 49, 317-323.

Khalaf, N.; Govardhan, C. P.; Lalonde, J. J.; Persichetti, R. A.; Wang, Y. F.; Margolin, A. L. Cross-linked enzyme crystals as highly active catalysts in organic solvents. J. Am. Chem. Soc. 1996, 118, 5494-5495.

Kinnear, K.T.; Monbouquette, H.G. An Amperometric Fructose Biosensor Based on Fructose Dehydrogenase Immobilized in a Membrane Mimetic Layer on Gold. Anal. Chem. 1997, 69, 1771-1775.

Kinnear, K.T.; Monbouquette, H.G. Direct Electron Transfer to *Escherichia coli* Fumarate Reductase in Self-Assembled Alkanethiol Monolayers on Gold Electrodes. Langmuir 1993, 9, 2255-2257.

Kluth, G. J.; Sung, M. M.; Maboudian, R. Thermal Behavior of Alkylsiloxane Self-Assembled Monolayers on the Oxidized Si(000) Surface. Langmuir 1997, 13, 3775-3780.

Korgel, B.A.; Monbouquette, H.G. Controlled Synthesis of Mixed Core and Layered (Zn,Cd) S and (Hg,Cd)S Nanocrystals within Phosphatidylcholine Vesicles. Langmuir, 2000, 16, 3588-3594.

Korgel, B.A.; Monbouquette, H.G. Quantum Confinement Effects Enable Photocatalyzed Nitrate Reduction at Neutral pH Using CdS Nanocrystals. J. Phys. Chem. B 1997, 101, 5010-5017.

Korgel, B.A.; Monbouquette, H.G. Synthesis of Size-Monodisperse CdS Nanocrystals Using Phosphatidylcholine Vesicles as True Reaction Compartments. J. Phys. Chem. 1996, 100, 346-351.

Linford, M. R.; Chidsey, C. E. D. Alkyl Monolayers Covalently Bound to Silicon Surfaces. J. Am. Chem. Soc. 1993, 115, 12631-12632.

Manoharan, H.C.; Lutz, C.P.; Eigler, D.M. Quantum mirages formed by coherent projection of electronic structure. Nature 2000, 403, 512-515.

Morgan, P. W.; Kwolek, S. L.; Pletcher, T. C. Aromatic Azomethine Polymers and Fibers. Macromolecules 1987, 20, 729-739.

Nalamasu, O.; Baiocchi, F. A.; Taylor, G. N. Photooxidation of Polymers. In Polymers in Microlithography: Materials and Processes, E. Reichmanis, S. A. MacDonald and T. Iwayanagi, Eds; ACS: Washington, D.C., 1989; pp. 189-209.

Nosaka, Y.; Ohta, N.; Fukuyama, T.; Fujii, N. Size Control of Ultrasmall CdS Particles in Aqueous Solution by Using Various Thiols. J. Colloid Interface Sci. 1993, 155, 23-29.

Porter, M.D.; Bright, T.B.; Allara, D.L.; Chidsey, C.E.D. Spontaneously organized molecular assemblies. 4. Structural characterization of n-alkyl thiol monolayers on gold by optical ellipsometry, infrared spectroscopy, and electrochemistry. J. Am. Chem. Soc. 1987, 109, 3559-3568.

Reichmanis, E.; Thompson, L. F. Polymer Materials for Microlithography. Chem. Rev. 1989, 89, 1273-1289.

Reipa, V.; Yeh, S.-M.L.; Monbouquette H.G.; Vilker, V.L. Orientation of Tetradecylmethylviologen on Gold and Its Mediation of Electron Transfer to Nitrate Reductase. Langmuir. 1999. 15. 8126-8132.

Rosenfeld, A.; Mitzner, R.; Baumbach, B.; Bendig, J. Laser Photolytic and Low Temperature Investigations of Naphthoquinone Diazides in Novolak Films. J. Photochem. Photobiol. A: Chem. 1990, 55, 259-268.

Sieval, A. B.; Demirel, A.L.; Nissink, J. W. M.; Linford, M. R.; Van Der Maas, J. H.; De Jeu, W. H.; Zuilhof, H.; Sudholter, E. J. R. Highly Stable Si-C Linked Functionalized Monolayers on the Silicon (100) Surfaces, Langmuir 1998, 14, 1759-1678., Sieval, A.B.; Vleeming, V.; Zuilhof, H.; Sudholter, E. J. R. An Improved Method for the Preparation of Organic Monolayers of 1-Alkenes on Hydrogen-Terminated Silicon Surfaces. Langmuir 1999. 15, 8288-8291.

Stamou, D.; Gourdon, D.; Liley, M.; Burnham, N.A.; Kulik, A.; Vogel, H.; Duschl, C. Uniformly Flat Gold Surfaces: Imaging the Domain Structure of Organic Monolayers Using Scanning Force Microscopy. Langmuir 1997, 13, 2425-2428.

Wagner, P.; Hegner, M.; Guntherodt, H.J.; Semenza, G. Formation and in situ modification of monolayers chemisorbed on ultraflat template-stripped gold surfaces. Langmuir 1995, 11, 3867-3875.

Wan, P.; Budac, D. Photodecarboxylation of Acids and Lactones. In CRC Handbook of Organic Photochemistry and Photobiology; W. M. Horspool and P.-S. Song, Eds.; CRC Press: Boca Raton, 1995; pp. 384-392.

Yasutake, M.; Wakiyama, S.; Kato, Y. Measurement of Si wafer and SiO2 layer microroughness by large sample atomic force microscope. J. Vac. Sci. Technol. B 1994, 12, 1572-1576.

SURFACE NANOPATTERNING

CROSS-REFERENCE TO RELATED APPLICATIONS

This application claims priority from, and is a 35 U.S.C. § 111(a) continuation of, co-pending PCT international application serial number PCT/US03/21496 filed on Jul. 8, 2003 designating the U.S., incorporated herein by reference in its entirety, which in turn claims priority from U.S. provisional application Ser. No. 60/394,701 filed on Jul. 8, 2002, incorporated herein by reference in its entirety. Priority is claimed to both of the above-identified patent applications.

STATEMENT REGARDING FEDERALLY SPONSORED RESEARCH OR DEVELOPMENT

This invention was made with Government support under Grant No. CTS-9816494, awarded by the National Science Foundation and Grant No. N00014-1-0919, awarded by the Office of Naval Research. The Government has certain rights in this invention.

BACKGROUND OF THE INVENTION

1. Field of the Invention

This invention pertains generally to the generation of nanoscale patterning on suitable surfaces and particularly to force directed nanoparticles utilized in nanopatterning, by inducible reactions, the surface of self-assembled monolayers that are anchored to atomically smooth surfaces. More particularly to electrophoretically directible photocatalytic quantum dots employed in nanopatterning, by photochemical reactions, the photocatalytically active surface of self-assembled monolayers that are anchored to atomically smooth surfaces. For exemplary purposes only and not by way of limitation, the stages involved in an embodiment of the subject nanopatterning comprise preparing and characterizing atomically smooth surfaces, synthesizing azide functionalized self-assembled monolayer (SAM) and modifying the smooth surface, synthesizing CdS and/or CdSe quantum dots of various sizes, characterizing and adsorbing them onto the SAM surface, photocatalytic reduction of the azide functionalized SAM and characterizing the reduced surface (using FTIR, STM, etc.), and demonstrating electrophoretic mobility of the quantum dots on the SAM with the simultaneous photocatalytic reduction to obtain nanopatterns.

2. Description of Related Art

Standard lithographic techniques for producing markings on surfaces will reach their useful limit for complex surface patterning at a feature size of ~100 nm. If the predicted size, speed and power advantages of molecular electronics are to be realized completely, means must be achieved to create complex patterns with a feature size of ~5-10 Å. At this molecular limit, logic devices with densities on the order of $10^{12}$ gates/cm$^2$ become conceivable.

Several researcher groups are working to develop nanocircuitry based on the self-assembly of carbon nanotubes into a two-dimensional grid. Others, (see below) plan to etch surface patterns using arrays of scanning probe microscopy (i.e., AFM or STM) tips. Both of these approaches are fundamentally different than the subject invention and do not permit the simultaneous creation of a billion or more (virtually an unlimited number) copies of a complex, user-defined nanopattern at high density on a surface.

Specifically, impressive progress has been made toward realization of nanoscale, molecular electronic devices. (1-3) Plausible designs have been conceived (3) and exciting experimental progress has been achieved. (4, 5) For example, Heath et al. (4) describe a molecular-based logic gate where redox-active rotaxanes serve as the switching elements. Rotaxanes are multicomponent structures consisting of a large dumbbell-shaped molecule and one or more ring-shaped molecules trapped on the dumbbell. The rotaxane used in this study showed 60- to 80-fold change in conductivity with redox state. Thus, this "molecular switch" could be opened by oxidizing the molecule resulting in dramatically reduced current flow. Although these rotaxane-based switches open irreversibly, Heath et al. envision such molecular switches as constituents of a chemically assembled electronic nanocomputer (CAEN), which will be based on chemically synthesized and assembled nano- or molecular-scale components including molecular-scale wires.

Given the finite yields of chemical reactions, a CAEN would have many defects. In an earlier publication, Heath et al. demonstrated a concept for a highly defect tolerant computer architecture that is directly relevant to CAEN design. (6) Their experimental system was a massively parallel computer built of relatively inexpensive components containing many defects. In their design, a "tutor" system locates and tags CAEN defects, which subsequently can be circumvented thereby enabling surprisingly powerful computational performance. However, an approach to assembling an actual CAEN with the necessary interconnections between molecular- or nano-scale logic gates has not been demonstrated in the laboratory.

Most proposed approaches to patterning surfaces at the molecular scale rely on AFM or STM, or self-assembly, although recently, "nanolithography at the Heisenberg limit" was reported which gave pattern resolution of ~20 nm. (7) This process did not involve lithography in the usual sense, rather a beam of metastable argon atoms passing through an optical standing wave was de-excited with a spatial dependence that resulted in the patterning of silicon or silicon dioxide substrates in the atom-beam path. A simple pattern of lines was created with a feature size limited by the Heisenberg uncertainty principle as applied to the position and momentum spreads of the localized metastable atoms. Although impressive, it is not apparent how this technique could provide a route to generation of complex, user-defined nanopatterns.

Ten years ago, researchers demonstrated the use of STM to deposit Xe atoms in precise locations to spell "IBM" on a single-crystal Ni substrate. (8) This impressive feat led to widespread speculation that scanning probe microscopy could lead to viable approaches for the nanopatterning of surfaces. More recently, another group showed that when silver nanoparticles are nudged along a silicon surface with an STM tip they leave behind a track of silver atoms. (9) In this way, "nanowires" might be drawn on a surface. However, as with the earlier STM work, huge technical obstacles remain in the development of STM-based nanopatterning of surfaces of the kind needed for nanocomputers where a repetitive pattern must be created over a macroscopic surface area. Patterning a macroscopic surface with a single STM tip would be impracticably slow, and processes based on vast arrays of tips appear enormously complex and expensive.

Many believe that the self-assembly approach will provide a means to generate molecular-scale patterns useful for nanoelectronic device manufacture. Indeed, many examples of highly ordered surface nanopatterns have been published based on molecular self-assembly of block copolymers and surfactants, for example. (10) The science of self-assembly still is in its infancy, however, and it is not a straightforward matter to program molecules to assemble into an arbitrary, user-defined nanopattern that would give the necessary interconnections between sites for logic gates.

BRIEF SUMMARY OF THE INVENTION

An object of the present invention is to provide a method of producing a nanopattern on a suitable surface.

Another object of the present invention is to furnish a method of generating a nanopattern on a self-assembled monolayer by use of a force motivated particle which interacts with an inducing event to produce a detectable trace on the monolayer.

A further object of the present invention is to supply a method of generating a nanopattern on a surface of a self-assembled monolayer, anchored to an atomically smooth substrate, by use of a electrophoretically motivated charged quantum dot which photocatalytically interacts with irradiation light to produce a detectable trace on the surface.

Still another object of the present invention is to disclose a method of generating one or more nanopatterns on a surface of a self-assembled monolayer formed from a plurality of photocatalytically reactive compounds, anchored to an atomically smooth substrate, by use of a electrophoretically motivated charged quantum dot which photocatalytically interacts with light to produce a photocatalytically induced trace on the surface.

Yet a further object of the present invention is to describe a product having a nanopattern altered surface, wherein the nanopattern altered surface is produced on a surface of a self-assembled monolayer, anchored to an atomically smooth substrate, by use of a force motivated nanoparticle which inducible reacts with an inducing event to produce a detectable trace on the monolayer surface.

Disclosed is a novel approach for creating complex, user-defined patterns on suitable surfaces at the molecular ("nano") scale. The subject approach to surface patterning may yield complex patterns with a feature size of ~25 Å (~2.5 nm), and perhaps smaller. The basic idea behind the subject nanopatterning process is to use a force field (e.g., an electric field/electrophoretic field, magnetic field, and the like) to direct the movement of path-directable nanoparticle (e.g., charged photocatalytic, semiconductor nanoparticles (e.g., CdS, CdSe, and the like quantum dots or Qdots)) around on a self-assembled monolayer (SAM) chemisorbed or otherwise anchored on an atomically smooth substrate (e.g., gold, silicon, and the like) while simultaneously exposing the surface to an inducing event that causes a chemical alteration in the surface of the monolayer (e.g., illuminating the surface (see FIG. 1)). If the surface of the SAM is comprised of chemical functional groups that can be photocatalytically altered by the Qdots then a trail of reacted molecules will be left behind as the Qdots are directed electrophoretically about the surface of the SAM. By changing the orientation of the electric field in the plane of the substrate, complicated patterns may be drawn. Large numbers of Qdots (billions, for example) could be spread on a SAM surface to draw the same pattern simultaneously. Further, if exposure to light is the inducing event, by intermittently shielding the light source, a non-reacted or "pen-ups" portion of the trace is included in the pattern.

A virtually unlimited variety of chemically functionalized surfaces with characteristic dimension similar to that of the photocatalytically active Qdots (~1-3 nm) could be built up from these patterned surfaces. The subject approach to surface patterning has the potential to yield complex patterns with a feature size of ~25 Å (~2.5 nm), and perhaps smaller. No other reported or planned technologies appear to exist to achieve such resolution in the production of user-defined, complex patterns on surfaces. Further, the subject invention involves wet chemistry and unsophisticated equipment, could be carried out in relatively inexpensive production facilities and means to pattern interconnections between the logic gates of a molecular computer. Further, the subject approach offers a route to the economical production of ultra-small, high-speed, and low-power devices that combine many functions such as sensing, image processing, computation, signal processing, and communications.

There are no published technologies available for patterning surfaces of any chemistry at the scale of a few nanometers. The subject approach entails a shift from current lithographic methods resulting in microscale patterns of inorganic materials to molecular dimension patterns, nanoscale, composed of organic chemicals. In addition to the tremendous organic synthesis knowledge base that can be drawn upon in the design of our surfaces, organic chemistry provides for straightforward interfacing with biological molecules and systems. Nanopatterned organic surfaces may enable the organization of effective molecular devices for the mimicry of biological systems such as those for vision, sensing, and complex-molecule synthesis. The subject process of nanopatterning may be employed for the templated synthesis of macromolecules of defined size, shape, and chemistry. Here, the nanopattern will serve as a guide for the assembly of monomers that subsequently may be cross-linked to form a macromolecule with a shape defined by the nanopattern. Such macromolecules could be designed to give fluids unique viscous and/or optical properties. Further, the subject invention may be able to produce, on demand, using templated synthesis, a set of pre-programmed molecular building blocks that could self-assemble to give "smart materials" for applications in molecular electronics, photoenergy transduction, or chemical catalysis.

The use of a light induced change in the surface of the monolayer to produce a detectable trace is used by way of example only and not by way of limitation and it is noted that other inducing events (chemical, electric, magnetic, and the like) are considered within the realm of this disclosure. Thus, for a photochemically related process, generally, the stages involved in the subject nanopatterning comprise several interrelated steps. An atomically smooth surface on a base substrate is prepared from a suitable material such as gold, silicon, silicon oxide, and equivalent substances. Photocatalytically active molecules, usually organic (again, it is stressed that organic molecules and inorganic molecules may be utilized to practice the subject invention), that self-assemble into a monolayer on the atomically smooth surface are obtained or synthesized and allowed to self-assemble on the selected atomically smooth surface into the photocatalytically active monolayer. Photocatalytic and charged nanoparticles/quantum dots are obtained or synthesized in various sizes, depending on their ultimate usage (e.g., width of the final detectable trace), from cadmium and either sulfur or selenium containing compounds and adsorbed onto the surface of the monolayer. The photocatalytic event on the surface of the monolayer is initiated by exposure to light, thereby producing a detectable area on the surface of the monolayer. The photocatalytic event produced detectable area is extended in a desired trace over the monolayer's surface by the application of variable electrophoretic forces. Clearly, the desired trace may be extremely complex and programmed by standard means to transpire.

Although the proposed technology may never completely supplant microlithography, it offers an entirely new approach that also provides a route to applications that are not completely foreseeable at this time. Our approach entails a shift from inorganic to organic chemistry for the patterning of surfaces. Besides the tremendous organic synthesis knowledge base that can be drawn upon in the design of our surfaces, organic chemistry provides for straightforward interfacing with biological molecules and systems. Nano-patterned organic surfaces may enable the organization of effective molecular devices for the mimicry of biological systems such as those for photoenergy transduction, vision, sensing, and complex-molecule synthesis.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 1 is an illustration depicting a basic electrophoretic cell in which the subject invention is practiced.

FIG. 2 is an illustration showing a more sophisticated electrophoretic cell than seen in FIG. 1. A photocatalytic CdS Qdot with positive surface charge moving under the direction of a variable (magnitude and direction) electric field across a lawn of reactive ligands chemisorbed on an atomically smooth substrate. An array of electrodes also could be used for computer controlled changes in electric field orientation in the plane of the surface. Those ligands in contact with the Qdot while it is illuminated will react leaving behind a trail of chemically modified species. Complex patterns with "pen-ups" and with a feature size similar to that of the Qdot (~2.5 nm) may be drawn by controlling the magnitude and direction of the electric field and by intermittently shielding the laser light source with a controllable shutter. Many CdS Qdots may be adsorbed on a surface to draw a pattern simultaneously.

Figure 5:
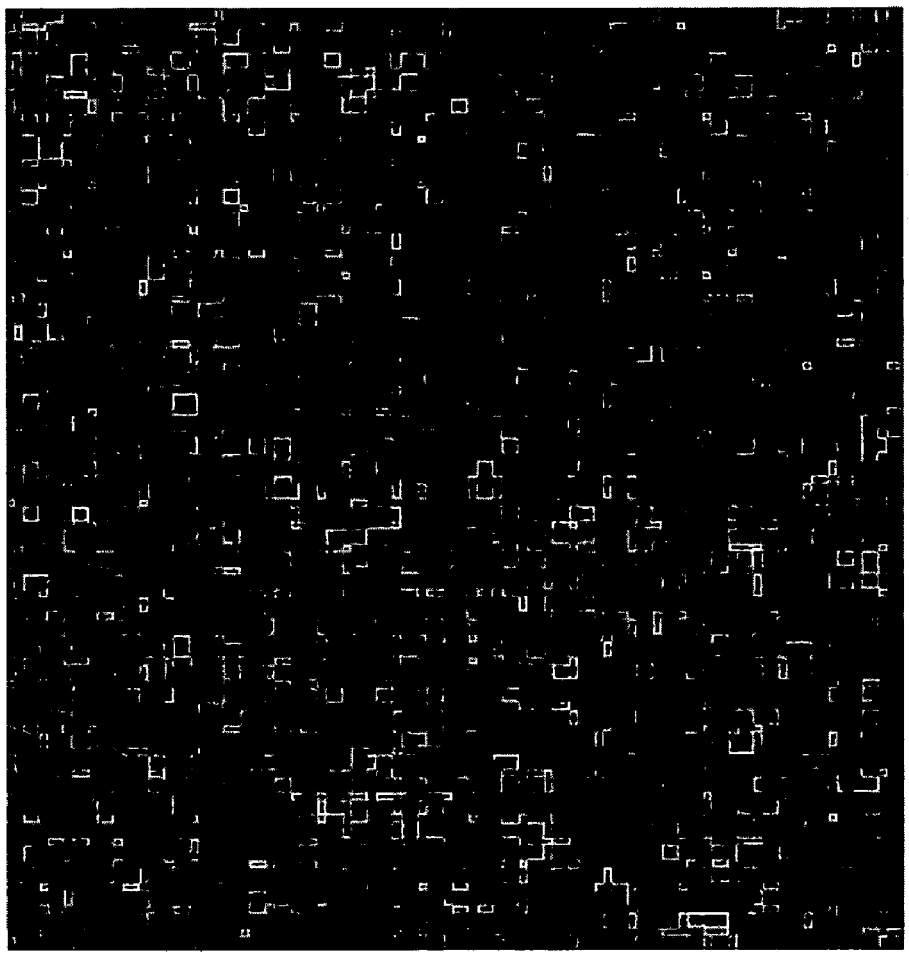

FIG. 5 is an AFM image of atomically smooth gold prepared as described above. Area: 25 $\mu m^2$. Roughness (rms): =2.64 Å.

Figure 6:
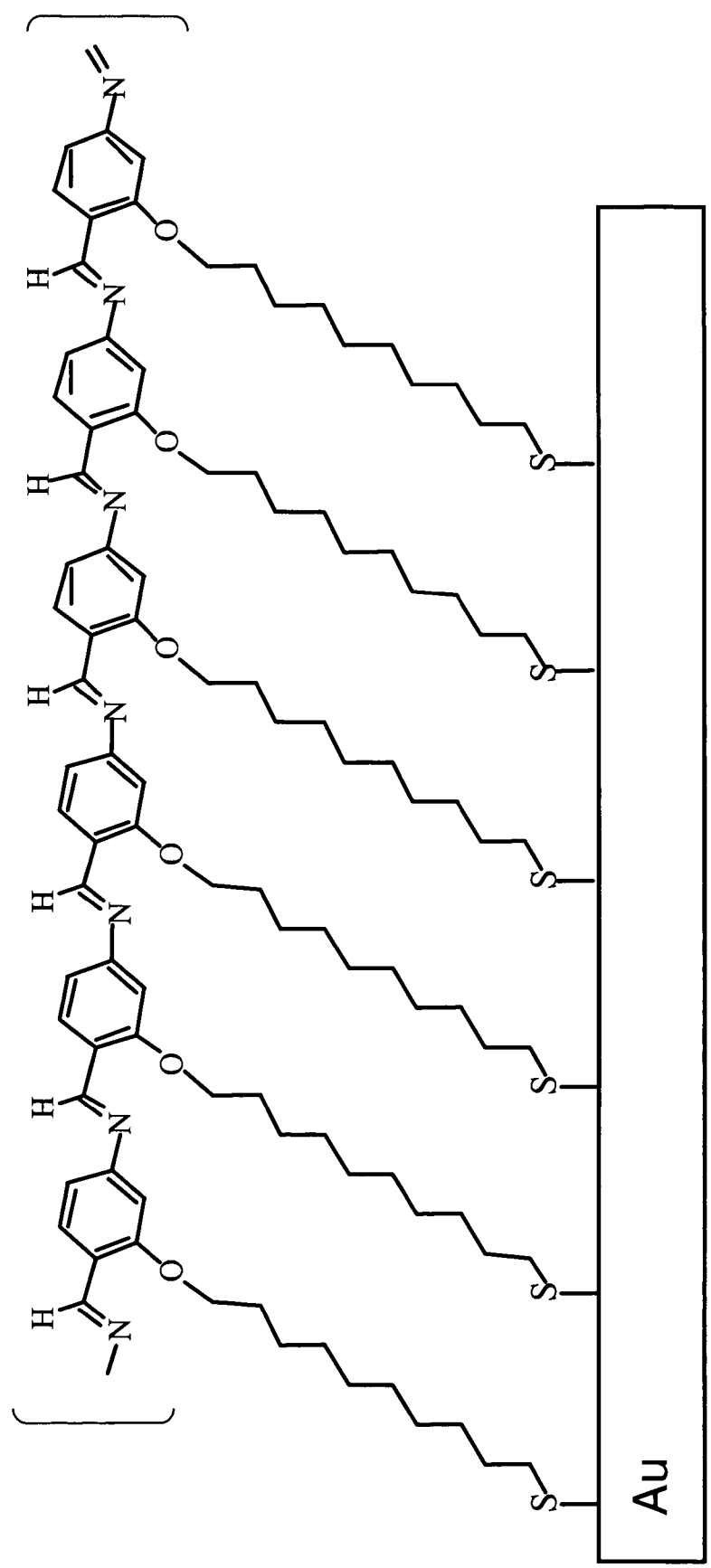

FIG. 6 is a schematic representation of polyarylimine formed by photocatalytic reduction of the surface adsorbed aromatic azidoaldehydes.

Figure 7:
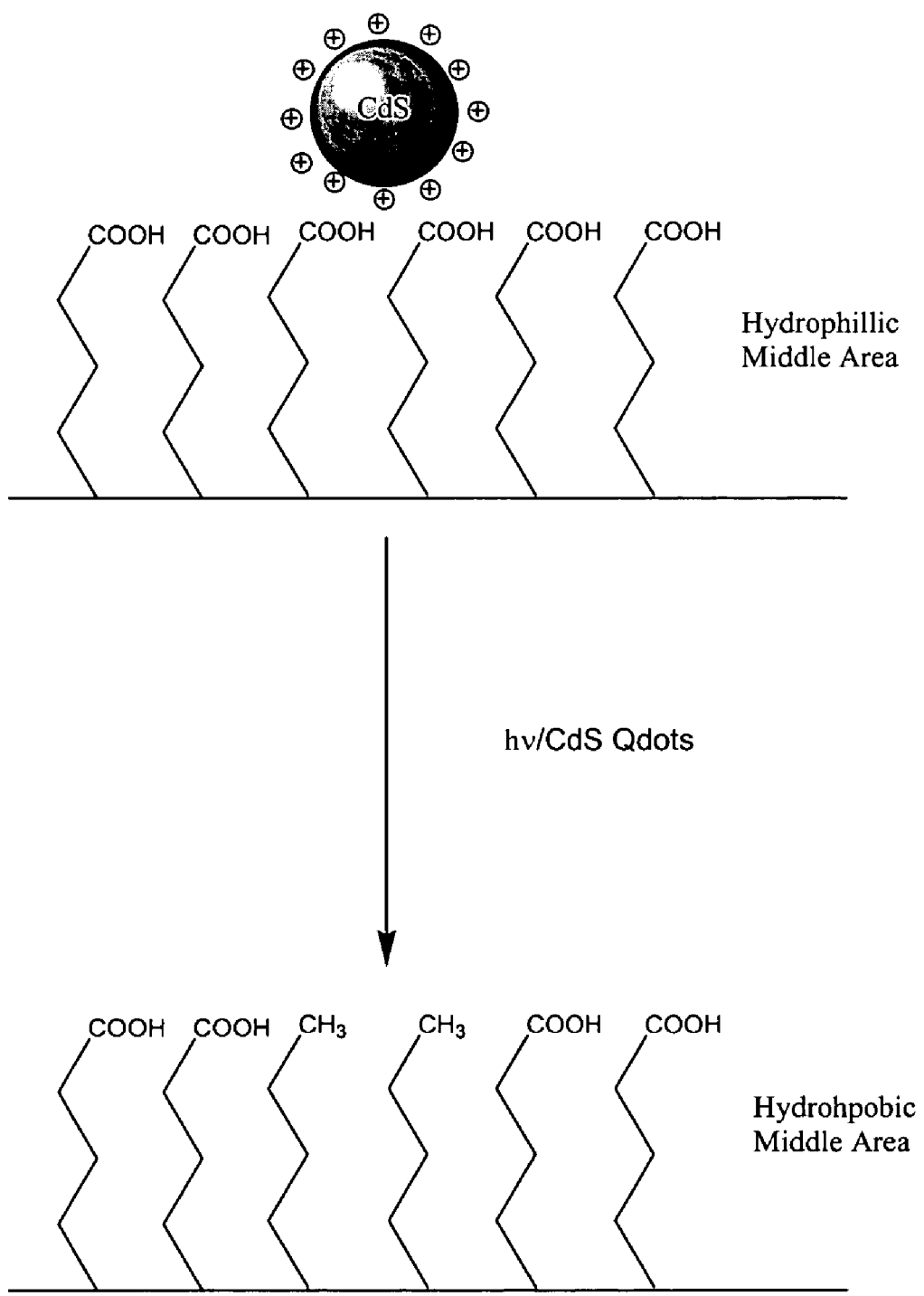

FIG. 7 is a schematic representation of a photocatalytic decarboxylation according to the subject invention.

Figure 8:
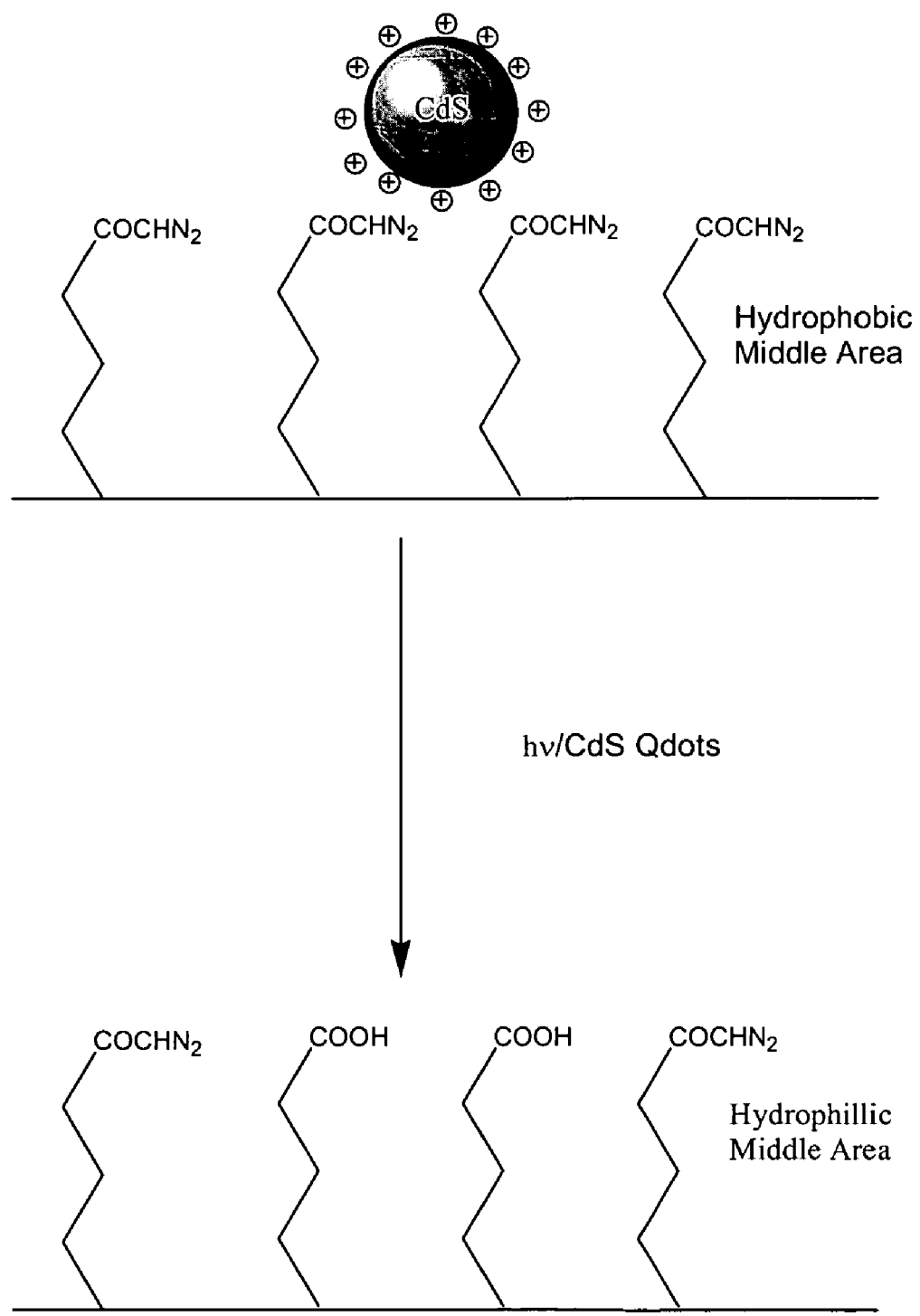

FIG. 8 is a schematic representation of a photocatalytic reduction of a diazoketone to a carboxylic acid according to the subject invention.

Figure 9:
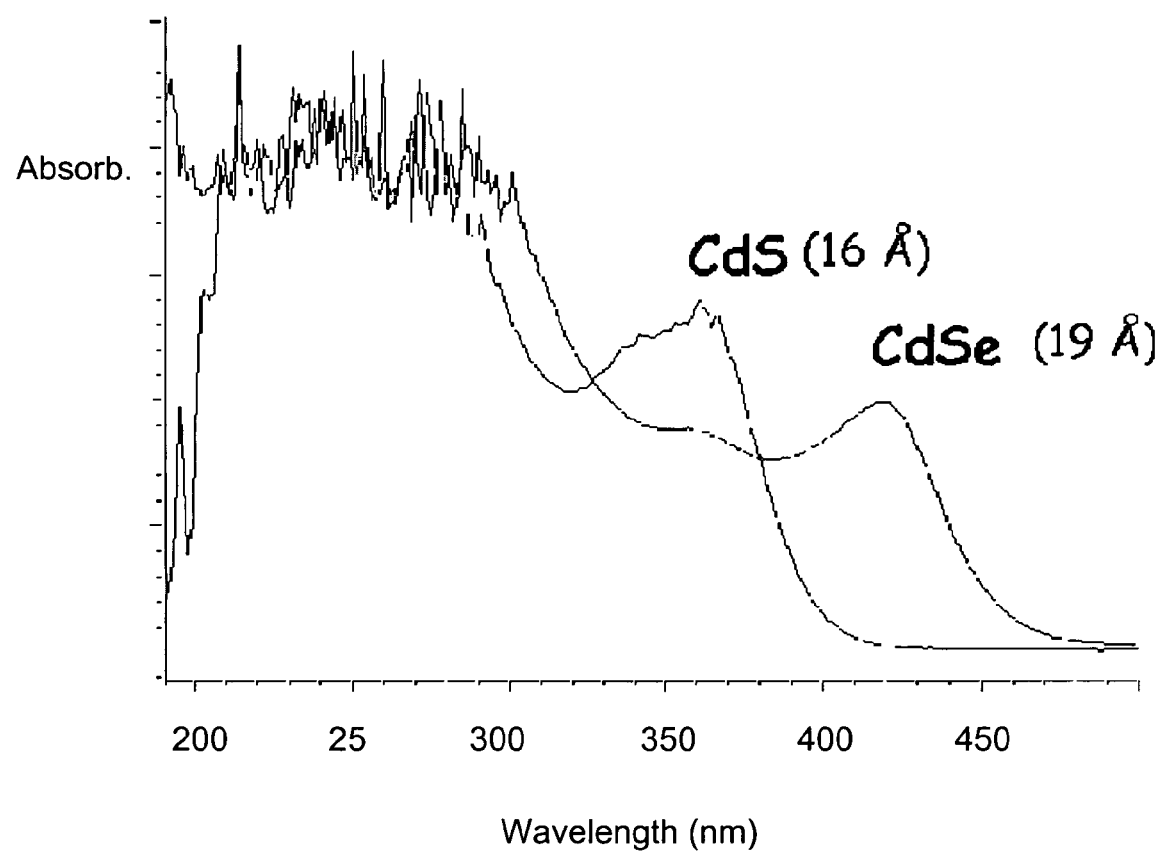

FIG. 9 shows absorbance spectra for CdS and CdSe Qdots.

Figure 10B:
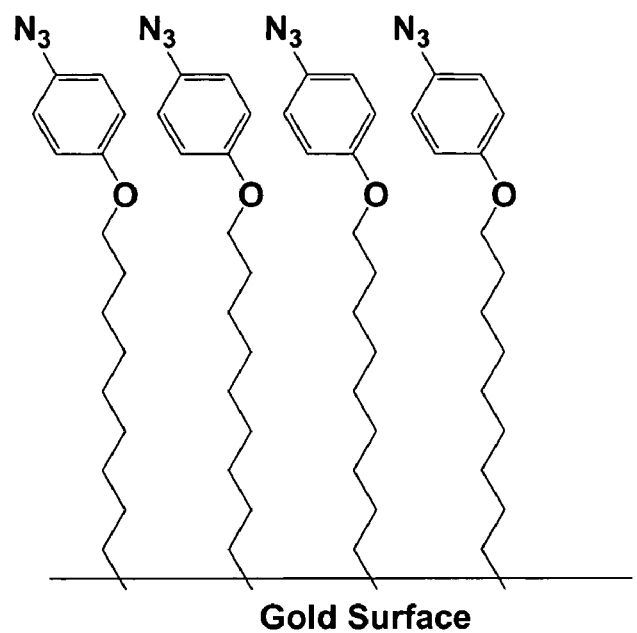
Figure 10A:
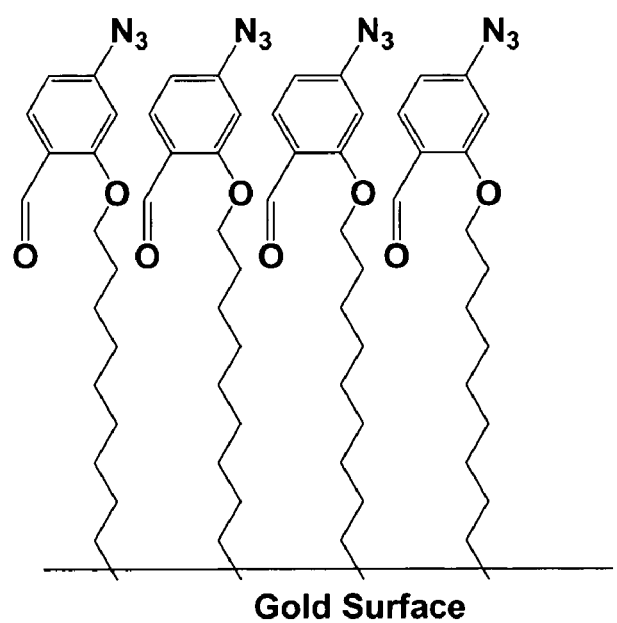

FIG. 10A is a first SAM anchored to gold example.

FIG. 10B is a second SAM anchored to gold example.

Figure 11:
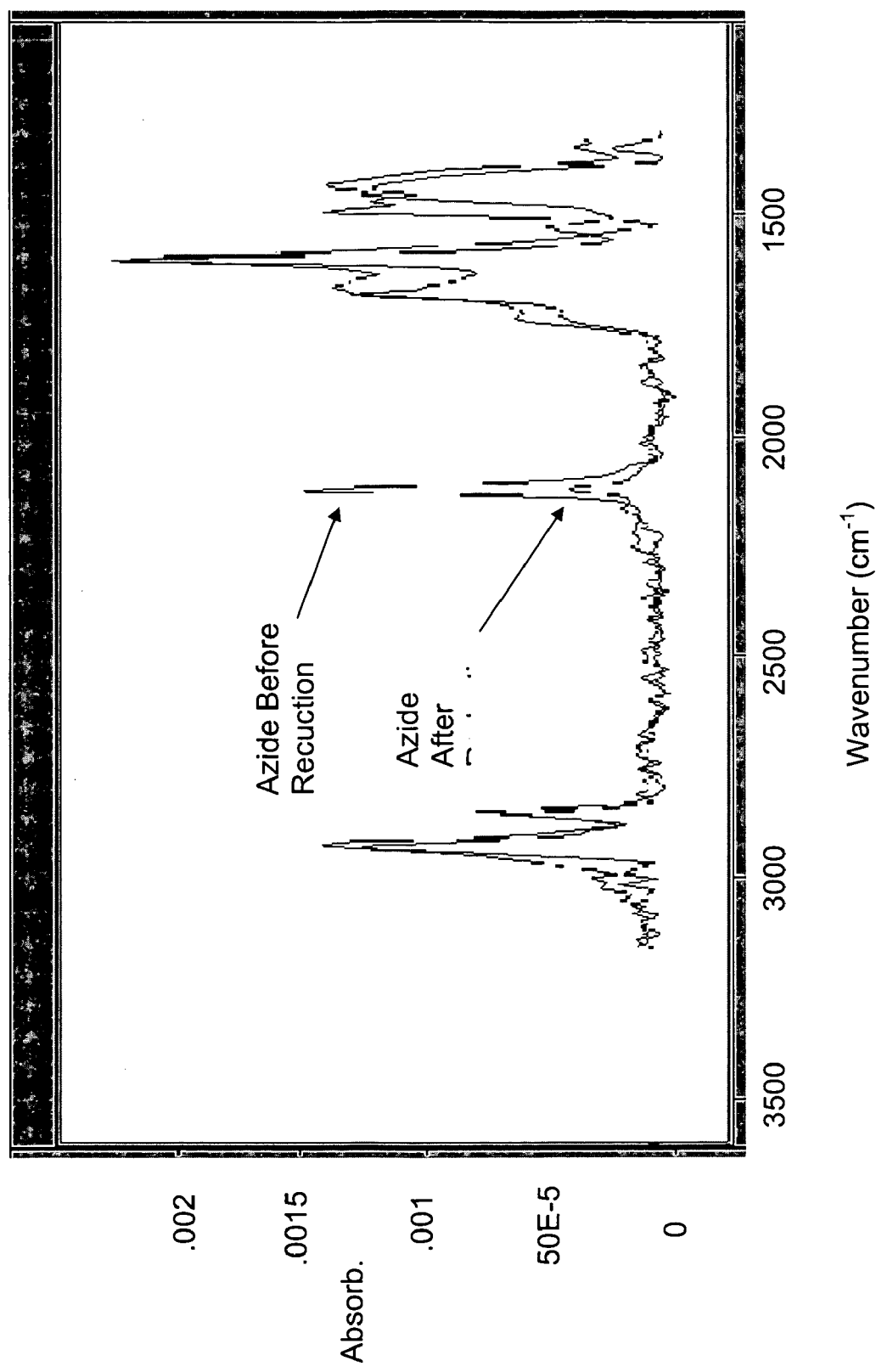

FIG. 11 shows the decrease in azide peak after exposure to light (photoreduction).

Figure 12:
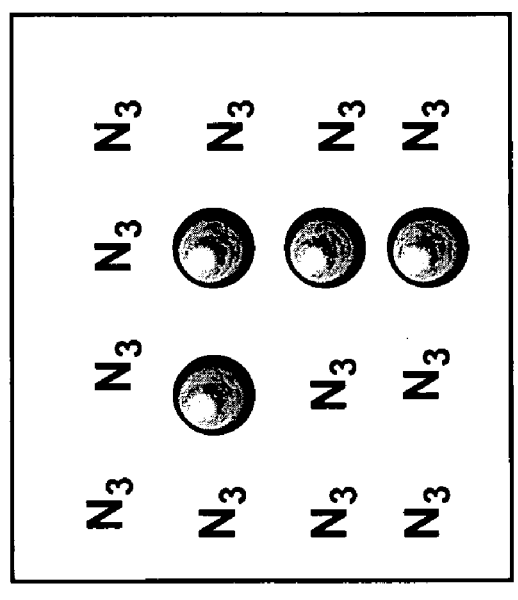
Figure 12:
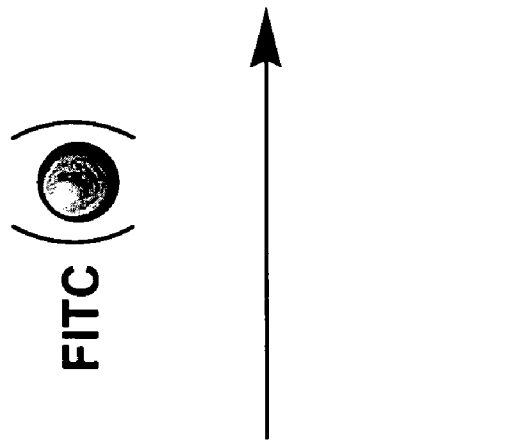
Figure 12:
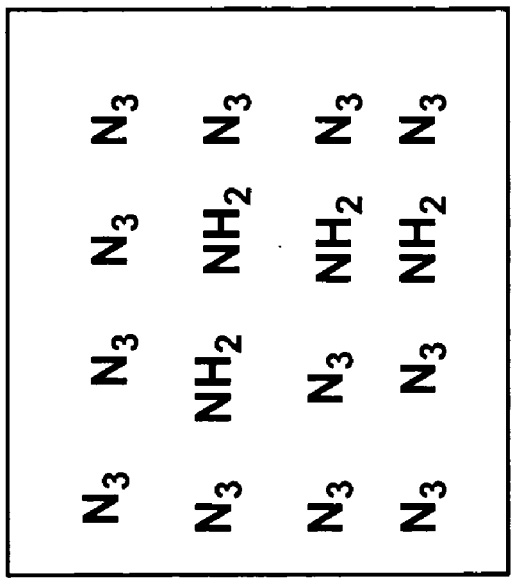

FIG. 12 shows a beginning surface with non-dye reactive azide groups (left) and the stained surface (right) having dye reactive amine group that are labeled with fluorescent molecules.

Figure 13:
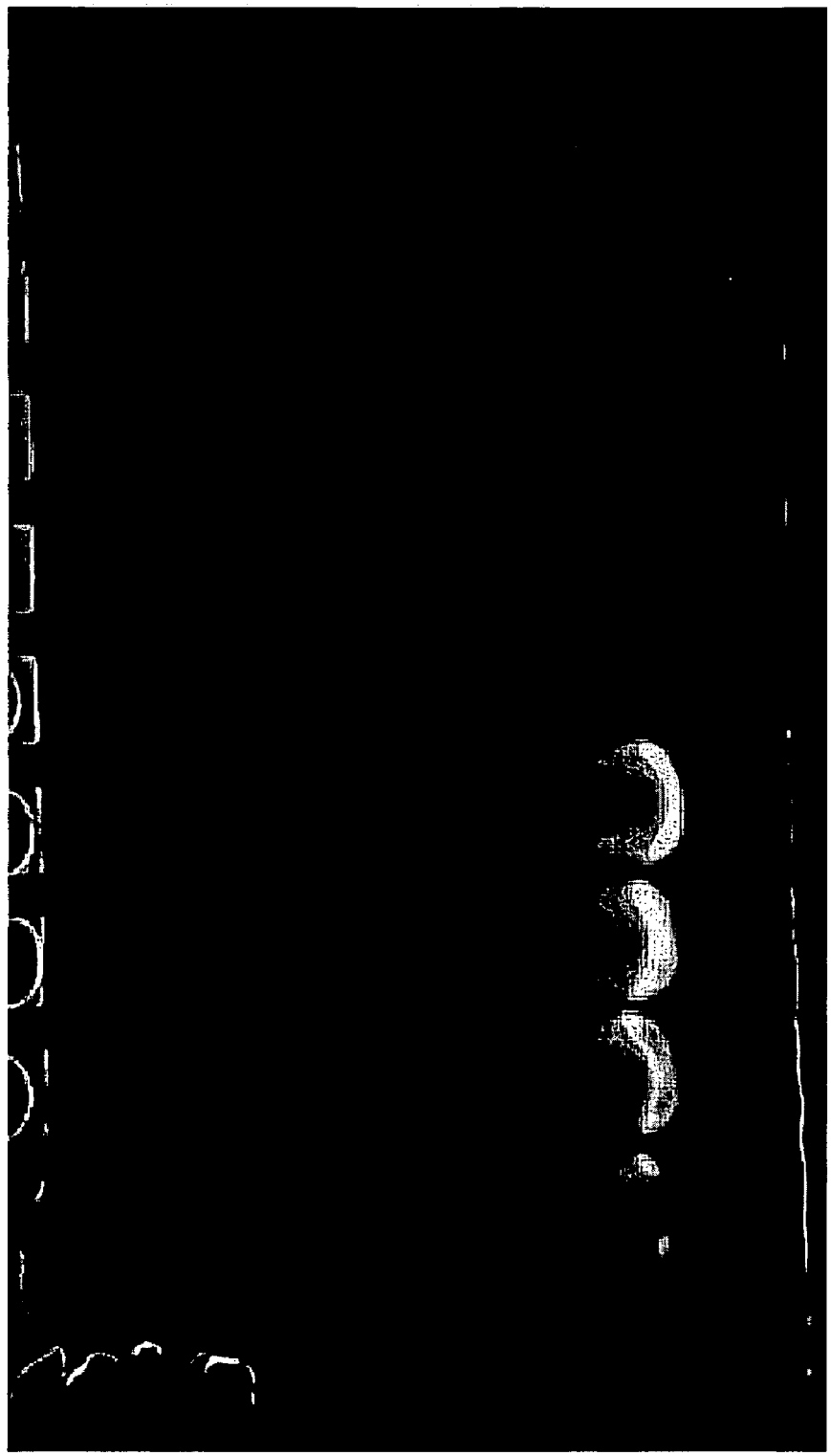

FIG. 13 show a fluorescence gel electrophoresis plate indicating the migration of CdSe Qdots under an electric field.

Figure 14:
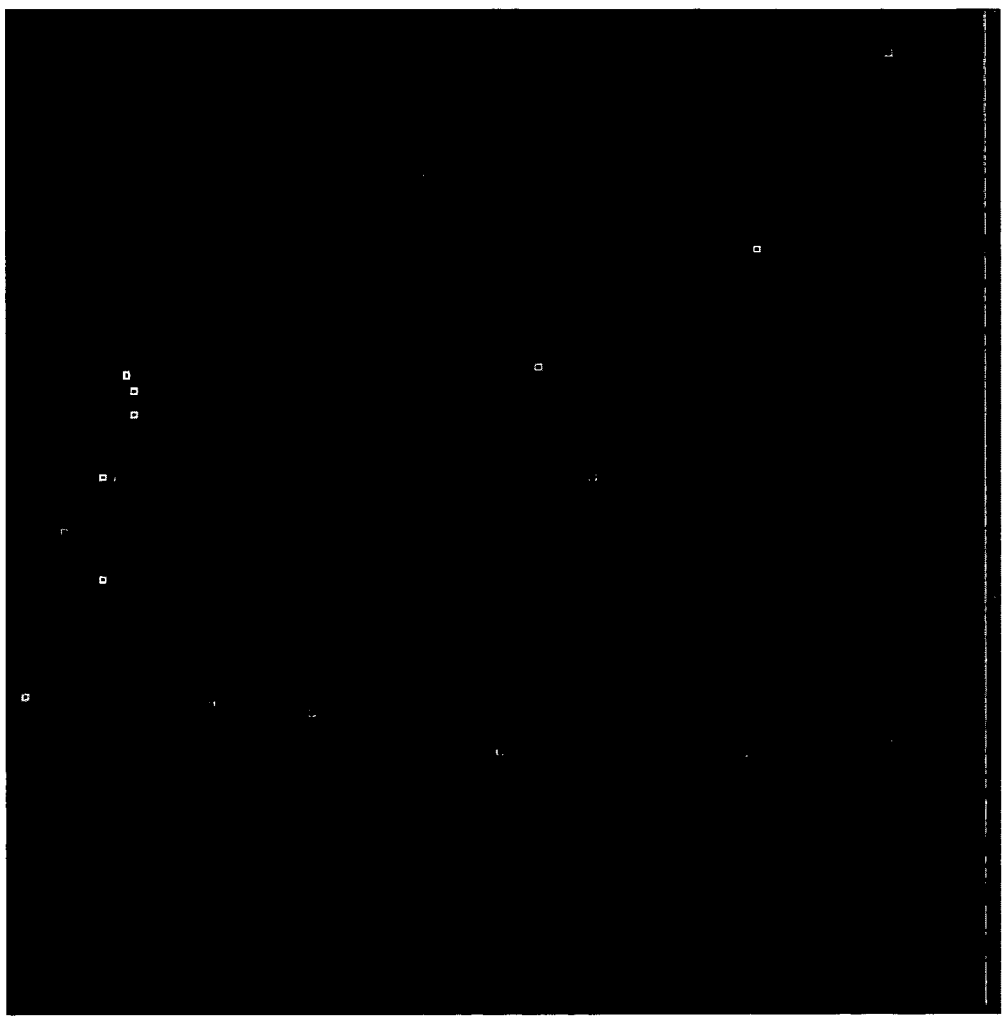

FIG. 14 shows a confocal microscopy image of CdSe Qdots adsorbed on $SiO_2$ deposited on an Si surface.

Figure 15:
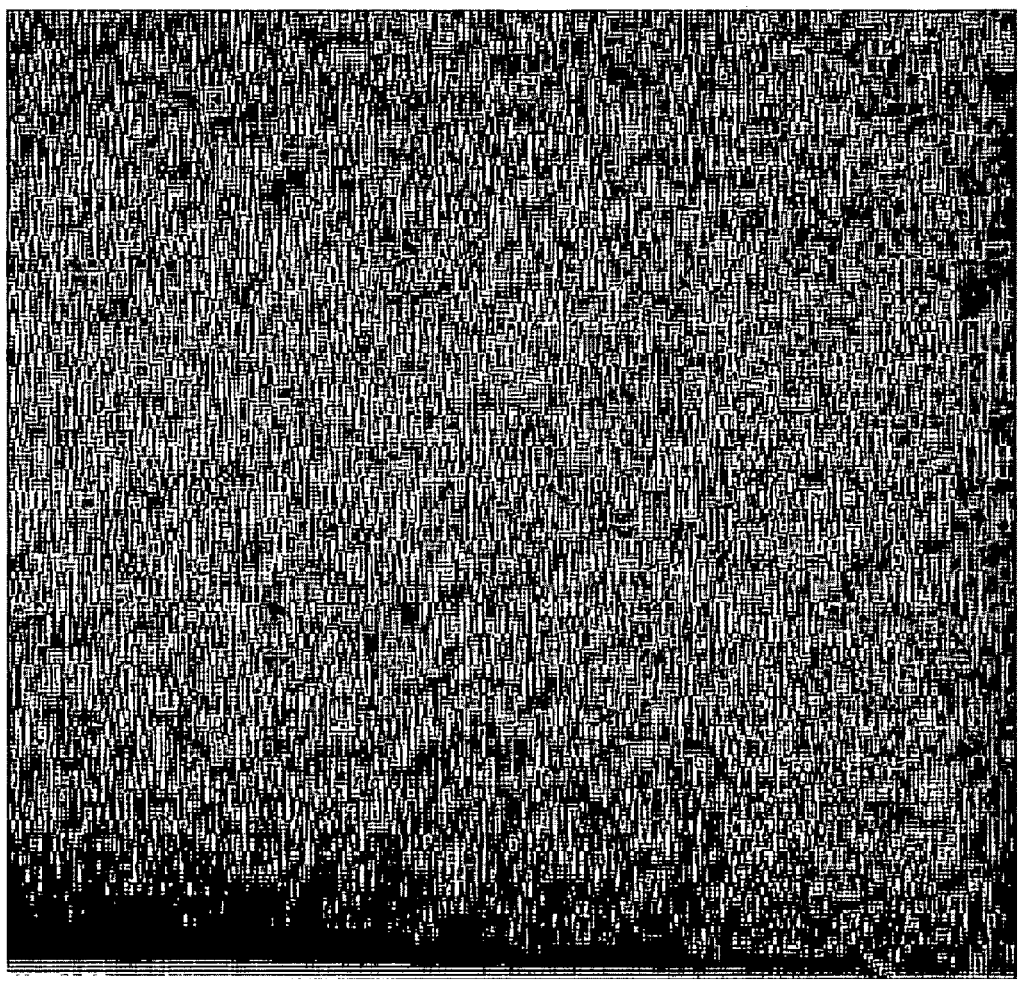

FIG. 15 shows surface electrophoresis of adsorbed Qdots on a $SiO_2$ surface by confocal microscopy.

DETAILED DESCRIPTION OF THE INVENTION

The concept behind the subject nanopatterning process is to use a force field (e.g., an electric field, magnetic field, and the like) to direct the movement of variable sized, path-directable nanoparticles ( e.g., photocatalytic quantum dots, (e.g., CdS and CdSe Qdots)) around on a self-assembled monolayer (usually organic, but inorganic is also contemplated) chemisorbed (or otherwise anchored) on an atomically smooth substrate (e.g., gold or silicon and the like) while simultaneously inducing a reaction (e.g., illuminating) the surface. If the anchored organic monolayer is composed of compounds that can be photocatalytically reduced by CdS Qdots, for example and not by way of limitation, then a trail or trace of reacted molecules, detectable state, will be left behind as the Qdots are directed electrophoretically about the surface.

For understanding one generalized embodiment of the subject invention, a useful analogy can be made between a common ballpoint writing pen that makes a user-directed line on a writing surface and the subject nanopattering device or nano-pen. The writing surface for the nano-pen comprises a suitably fabricated self-assembled monolayer, SAM, that is anchored to an atomically smooth underlying substrate. The exposed surface of the SAM comprises a plurality of chemical functional groups that are photocatalytically active under specific selectable conditions. The subject invention utilizes a charged quantum dot containing cadmium and either sulfur or selenium and ionizable organic moieties as the "ballpoint" of the nano-pen. In place of a user motivating and directing the path of the ballpoint pen, electrophoretic forces are employed in the subject device to direct the charged quantum dot in any desired direction. Utilizing the contacting charged quantum dot in conjunction with the photocatalytically active chemical functional groups on the surface of the SAM, laser light is used as the "ink" in the nano-pen. When the charged quantum dot passes along the surface of the SAM and is exposed to laser light a "traced path" of reacted surface chemical functional groups results, thereby generating any desired nano-pattern on the SAM's surface.

Figure 1:
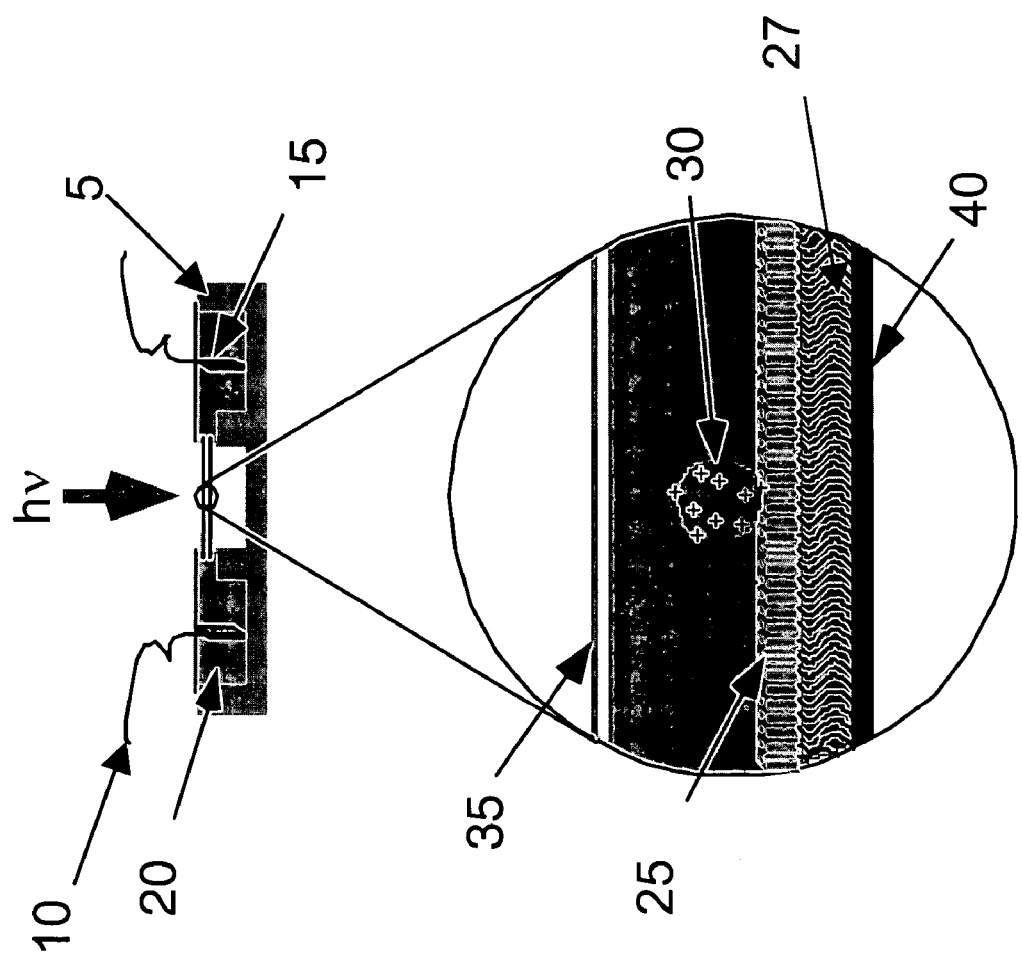

FIG. 1 illustrates one embodiment of the subject invention. An electrophoretic cell 5 is comprised of two chambers with appropriately charged electrodes 10 and 15 in each chamber to provide an electrophoretic force through a conducting solution 20. A narrow reaction volume extends between the two chambers and is expanded in the lower portion of FIG. 1. As is seen in the lower portion of FIG. 1, a self-assembled monolayer of photochemically reactive moieties 25 and substrate binding tails or substrate attachment regions 27 has a photocatalytic charged nanoparticle (Qdot) 30 adsorbed to its exposed surface. A cover slip 35 rests above the reaction volume. The substrate binding tails 27 are anchored to a substrate support 40 by variable chemical and/or physical means. Activation of the photocatalytic charged nanoparticle 30 is achieved by illumination (arrowed hυ) into the reaction volume, thereby producing a detectable trace along the surface on the monolayer and the electrophoretic force move the photocatalytic charged nanoparticle 30.

Figure 2:
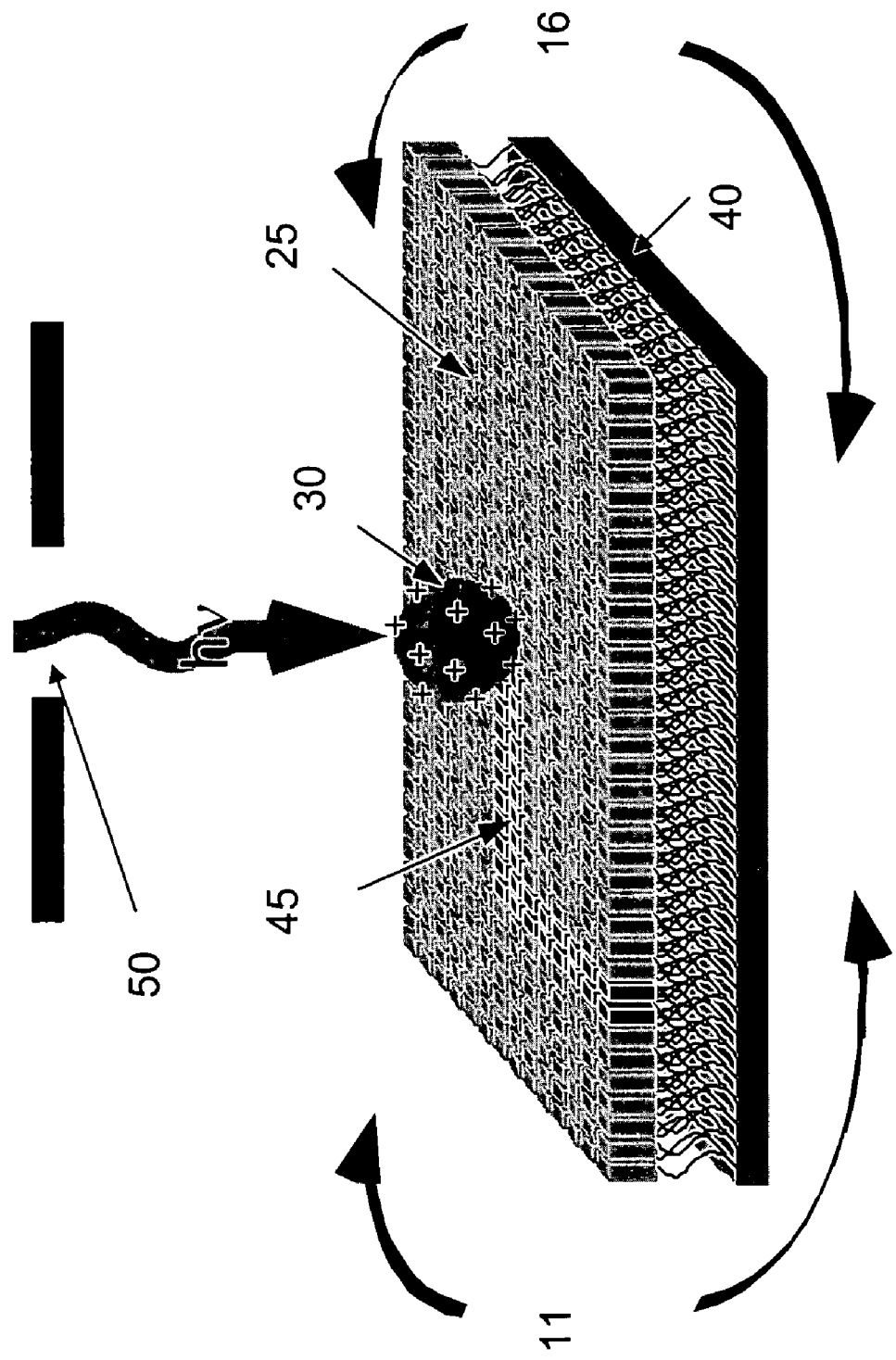

FIG. 2 illustrates a more sophisticated electrophoretic cell in which two-dimensional motion by the charged nanoparticle 30 is seen. The supporting substrate 40 has the monolayer's photocatalytically active surface groups 25 anchored to it. By changing the orientation of the electric field 11 and 16 in the plane of the substrate, complicated detectable nanopatterns 45 may be drawn. It is clear that large numbers of Qdots could be spread on a surface to draw the same pattern simultaneously. Further, by intermittently shielding, via a shutter 50, the light source, "pen-ups" can be included in the pattern. A virtually unlimited variety of chemically functionalized surfaces with characteristic dimension similar to that of the photocatalytically active Qdots (~1-3 nm) could be built up from these patterned surfaces. The subject invention could accelerate the study of quantum structures, such as quantum mirages (11), and may eventually lead to a relatively inexpensive means to pattern interconnections between components of a molecular computer. (4, 6)

This technology is dependent on frontier science in a number of areas including nanoparticle photocatalysis, Qdot surface electrophoresis, and photoreactive self-assembled monolayers. Colloidal semiconductor particles have long been used as photo-initiators of free radical polymerizations without a clear understanding of the relationship between improved catalytic performance and reduced size, beyond recognition of the increased surface to volume ratio for smaller colloids. (12) CdS Qdots are excellent photocatalysts due to the increased energy of excited electrons in comparison to the bulk semiconductor. (13) In fact, CdS Qdots can photocatalytically reduce nitrate, whereas bulk CdS shows no nitrate photoreduction activity. Further, the expected relationship has been shown to exist between particle surface charge and photocatalytic rates. CdS Qdots surface-passivated with positively charged amine-terminated thiols are far more active for anionic nitrate reduction than carboxy-terminated particles. (13) Thus, semiconductor Qdots can be tailor made to suit a given photocatalytic application by manipulating core composition, size, and surface chemistry.

By termination of Qdots with charged functional groups (e.g., amines, carboxyls, and the like), they are made electrophoretically mobile. In fact, gel electrophoresis has been used to size fractionate CdS Qdots with surface-adsorbed polyphosphate. (14) However, no previous studies of Qdot electrophoresis on surfaces exist. There is a necessity for balancing the need for a strong interaction between the nanoparticle and the support, in order to damp Brownian motion, with the electrophoretic force required to move the Qdot about the surface. The subject system has been designed such that the primary interaction between the highly charged Qdot and the surface will be electrostatic. The energy of electrostatic interactions generally is greater than kT, and it is not anticipated that surface Brownian motion will be a problem, although the relationship between the particle-surface bonding energy and the frictional resistance to surface motion is not straightforward (15). The electrophoretic driving force on the particle equals qE, where q is the effective charge on the particle and E is the electric field. This force must be sufficient to overcome the frictional resistance due to the interaction of the particle with the substrate. Given the large charge on ~25 Å amino-terminated nanoparticles at neutral pH and low ionic strength, ~80+, this driving force is large at modest field strength. Further, in one embodiment of the subject invention, a surface azide is reduced to an electro-positive amine which will repel the particle as it photocatalyzes the reduction reaction along its path. Also, the ionic strength of the surrounding aqueous solution can be adjusted to control the strength of the electrostatic interaction.

Although we will use "atomically smooth" surfaces for this work, an additional impediment to particle movement will be the occasional underlying step up of one or more atomic diameters on the substrate. Since an atomic step on silicon or gold surfaces measures just a few angstroms, it is not expected that such a step will present a significant barrier to our order-of-magnitude larger, ~25 Å-diameter particles. The rms roughnesses measured for Si/SiO$_2$ or gold surfaces of the type used are 1-1.5 Å or 2.5 Å (16, 17), respectively, which is consistent with the notion that the roughness largely is due to atomic steps. Further, alkyl spacers (often a plurality of methylenes) between the smooth substrate and the photocatalytically reactive group of the surface adsorbed ligands tend to smooth out defects in the underlying substrate through rotation about the C—C bonds to adjust their length. The driving force for this smoothing effect arises from a lowering of the surface energy when more of the hydrophobic spacer is shielded from contact with the aqueous solvent. Based on these arguments, it appears very likely that these Qdots move electrophoretically about a modified surface as intended.

The design of the subject substrate adsorbed organic layer produces an exposed surface of sufficient uniformity and photocatalytic activity. High quality, self-assembled monolayers (SAMs) of organic compounds have been created on both gold and silicon surfaces. (18-28) The best known of these are composed of thiols on gold and silanes on the native oxidized layer of silicon. In both cases, tightly packed, ordered SAMs have been characterized by a variety of techniques including scanning probe microscopes. SAMs on gold electrodes have proven to be effective insulators in electrolyte solutions due to the highly ordered, close-packed nature of chemisorbed alkanethiols in particular. (18) For the subject technology, the rate of Qdot movement on such layers terminated with reactive groups must be balanced with rates of reaction to ensure that continuous lines of chemically modified ligands can be drawn. The exemplary azide and other chemistries chosen were selected partially for their fast reaction rates, i.e., reaction time scales on the order of sub-picoseconds to nanoseconds. A 5 mW, 400 nm laser irradiating ~0.07 cm$^2$ of surface results in ~4500 photons/sec striking an individual ~25 Å nanocrystal. This is sufficient to ensure that a trail of reacted surface ligands will be left behind a Qdot moving at 100 nm/s given the rapid, high-quantum-yield (>20%) chemistry to be employed. Here, the flux of photons (which is proportional to laser power) likely will limit the rate at which the nanoparticles can be moved about the surface.

The actual drawing of complicated patterns requires that the electric field be re-oriented in the plane of the substrate in a programmed manner. As indicated above, "pen-ups" in the pattern may be introduced simply by intermittent shielding from the light source. In the usual case, a large number of Qdots could be adsorbed on a substrate to draw up to ~10$^{10}$-10$^{12}$/cm$^2$ copies of the same pattern simultaneously. State-of-the-art wet chemical methods for synthesis of CdS Qdots give size populations with a standard deviation of ~5% about the mean. Separation by gel electrophoresis can be used to decrease the breadth of the distribution to a standard deviation of 2-3%. (14) Nevertheless, there is normally a distribution in particle surface charge and in electrophoretic mobility.

The subject invention has been demonstrated in one fashion by using aryl azide chemistry, which is chemisorbed onto atomically smooth gold substrate through a thiolate linkage. CdS Qdots terminated with tertiary amines are employed as the electrophoretically mobile photocatalysts. A 5 mW InGaN diode laser may be used, for example, and a Hg(Xe) lamps with optical filters was used as the required ~400 nm light source. An additional demonstration of the subject invention is provided with a Si/SiO$_2$ substrate as the atomically smooth substrate and a variety of photocatalytically chemistries including photodecarboxylations, photodenitrogenations, and photoreductions of aromatic nitro compounds.

The latter chemistry may provide a route to the drawing of conducting polymer "wires" on the surface.

Substantial information exists concerning CdS Qdots synthesis (13,34,35). For the subject invention a capping method for synthesis of the CdS Qdots is employed which was used in earlier photocatalytic work. (13, 26, 37)

A first experimental example of the subject invention involves the use of CdS Qdots as photocatalysts and a photoreducible azide compound. The azide synthesis is as follows (see Scheme 1): Commercially available 4-amino-2-hydroxybenzoic acid is converted to the corresponding azide via the diazonium salt. Esterification of this acid allows the selective alkylation of the phenolic oxygen with 10-tert-butyl-dimethylsilyloxy-1-methanesulfonyloxydecane.

Removal of the silyl-protecting group followed by the simultaneous re-protection/activation of the isolated primary alcohol permits the reduction of the ester. The primary mesylate of the benzyl alcohol is then thiolacetylated to add the required thiol-carbon bond. The oxidation of the remaining free alcohol to the aldehyde followed by the base-catalyzed hydrolysis of the thioacetate yields the disulfide only. This sequence has been completed and the required disulfide has been characterized. The synthesis has been optimized.

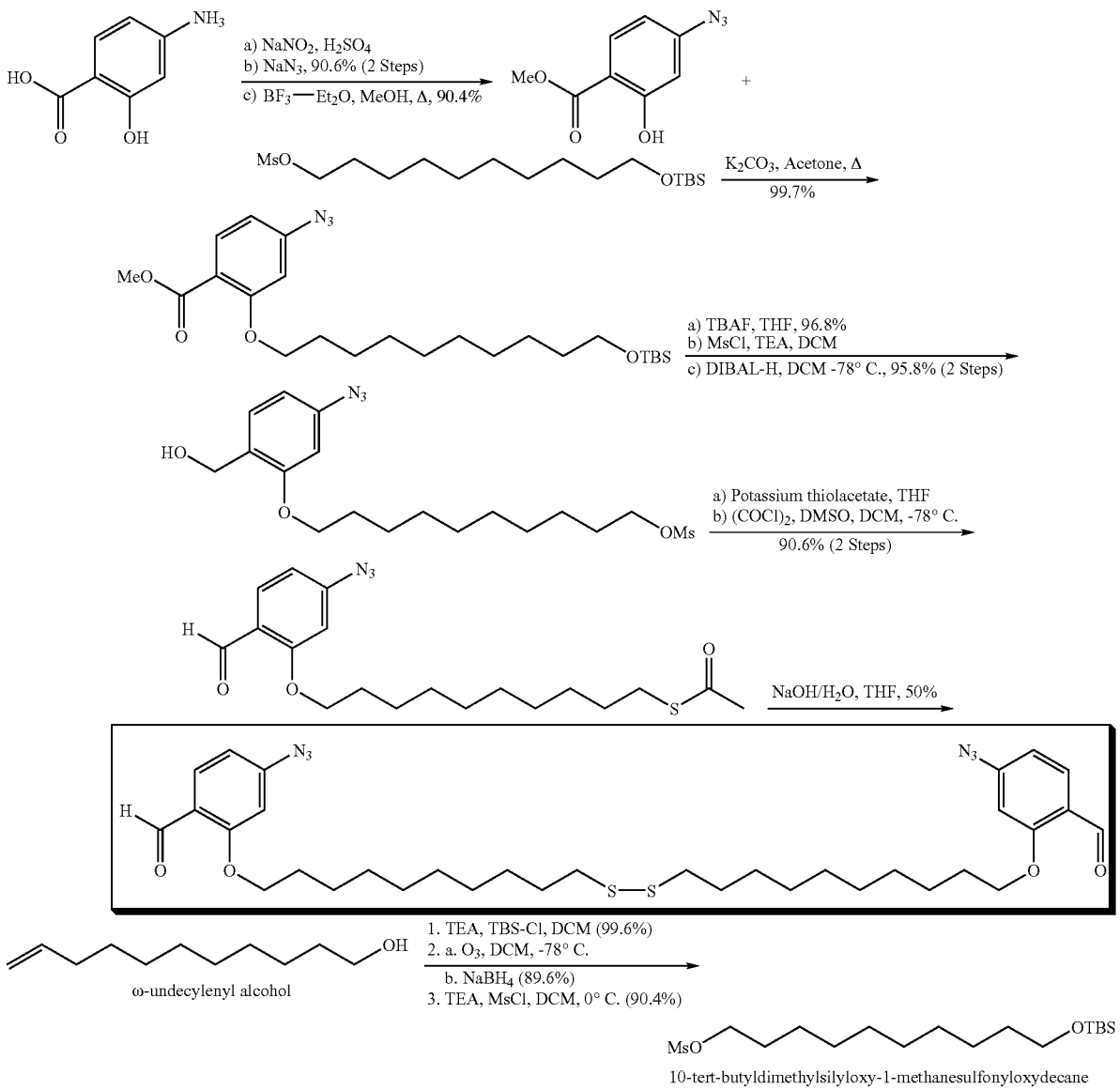

Figure 3:
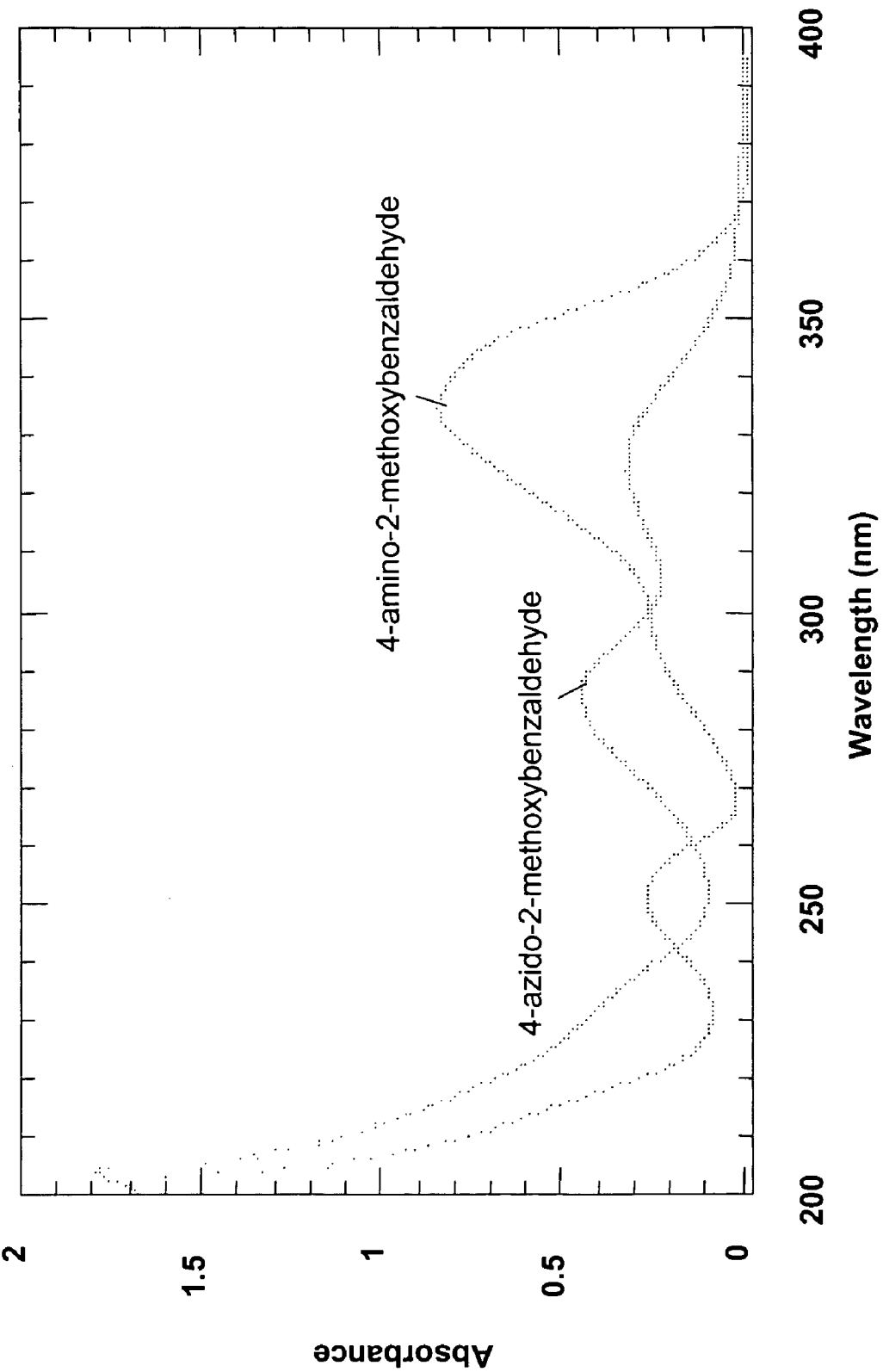
FIG. 3 is UV-spectra of the azido- and amino-aldehyde compounds.

It has been shown that the water-soluble azide (without the thiolated alkane tail) (see Scheme 2), can be photocatalytically reduced by amine-terminated CdS Qdots at wavelengths greater than 400 nm where significant photolysis of the azide does not occur (see FIG. 3). This azide derivative is synthesized in an analogous fashion to the azido-disulfide shown previously.

Scheme 2:
Water-Soluble Azide/Photoreduction

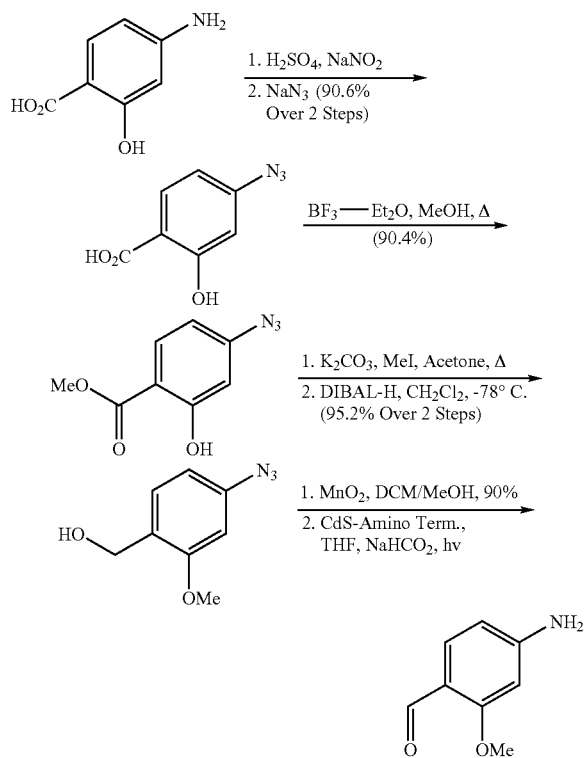

The above reduction is an important result in demonstrating the reduction to practice of the subject invention chemistry for nanopatterning using mobilized, surface-adsorbed CdS Qdots as photocatalysts. In addition to reduction of the azide in THF/water solution, it has been shown that the azide is transformed in the presence of nanoparticles, light, and methanol in aqueous solution. Here, methanol serves as sacrificial electron-donor and addition of sodium formate is not required. The quantum yields for these photoreductions range from 17-60% (see FIGS. 4A (formate) and 4B (methanol)).

Experiments have been conducted to study the behavior of aromatic azidoaldehydes under reducing conditions. Upon treatment of the azidoaldehyde with triphenylphosphine or stannous chloride, the infrared absorbance of the azide disappears. In addition, polymeric material is formed (see Scheme 3). The ease with which amines and aldehydes react to form imines suggests that this polymeric material is likely to posses a polyaryl imine backbone, which could prove to be conducting.

Scheme 3:
Reduction of Azide and Polymer Formation

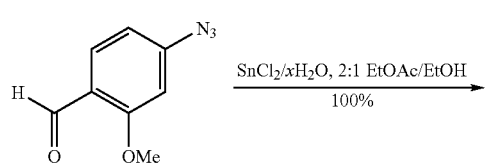

-continued

[structure: benzaldehyde with NH2 and OMe] → Benzene, H2SO4, Δ → polymeric material The extreme sensitivity of the polymer product with regard to hydrolysis has limited its characterization ($^1$H/$^{13}$C NMR, EI/CI LRMS, Electrospray MS, FAB MS). Best efforts at characterization support the formation of a tetramer (FAB MS). The degradation of imine-polymer compounds by hydrolysis is well precedented. (29)

Gold substrates have been created (16, 30). Ultra-flat, atomically-smooth, Au(111) surfaces of high quality have been prepared (i.e., with rms roughness of approximately 2.5 Å over 25 μm$^2$ as measured by AFM, see FIG. 5). The method involves depositing gold on atomically smooth mica. A piece of silicon wafer is adhered to the exposed gold using a ceramic glue, Epo-tek 377. Chemical and mechanical means are used to strip away the mica thereby yielding the desired gold surface.

Acquisition of the atomically smooth gold surfaces has allowed the characterization of the azide-thiol self-assembled monolayer (SAM). Using FTIR-external reflectance spectroscopy, the IR spectrum of the SAM has been collected and compared positively to the azide-disulfide solution IR spectrum.

In one embodiment of the subject invention, experiments with SAMs on gold were conducted (31-33). In another embodiment of the subject invention Si/SiO$_2$ is utilized as the supporting substrate.

Surface photocatalytic azide reduction by immobile CdS nanoparticles: CdS nanoparticles capped with dimethylaminoethanethiol are deposited in a macroscopic pattern using a micropipette on a gold substrate modified with an azido-disulfide SAM (see Scheme 1 above). Use of the dimethylamine as the Qdot capping agent ensures that the particles carry a surface charge and that these surfaces are inert to the proposed reaction chemistry. The positive surface charge of ~80+ enable a strong electrostatic interaction of the Qdots with the polar azide surface. The interaction energy, w(r), between an ionic species and a dipole is given by, $$w(r) = -\frac{(ze)u\cos\theta}{4\pi\varepsilon_0\varepsilon r^2},$$

where z is the charge on the ionic species; e is the electronic charge; u is the dipole moment; θ is the angle the dipole makes with the normal to the ion; $\varepsilon_0$ is the permittivity of free space; smooth, ε is the dielectric constant of the solution; and r is the center-to-center distance between ion and dipole. (15) The strength of such interactions normally is much greater than kT in vacuum and normally is equal to or greater than kT in water. (15) It is believed that the aldehyde and azide groups on the surface adsorbed compound rotate to orient the molecule's dipole (calculated at 4.1 Debye by the AM1 method) in the direction of an approaching CdS Qdot carrying a net charge of 80+. Therefore assuming θ equal to ~0, an interaction energy in water at 298 K of ~2.5 kT is calculated using the equation above. However in the subject case (see FIG. 2), the effective interaction energy between the Qdot and the surface is enlarged several fold, because many surface ligands will interact simultaneously with an adsorbed nanoparticle. The strength of this interaction may be gauged experimentally by rinsing the surface after adsorption of the Qdots with water of increasing ionic strength and assaying the rinse water for Qdot fluorescence. Previous work with CdS nanoparticles has shown them to fluoresce with high quantum yield. (34, 35) Retention of the particles in the original pattern on the substrate after rinsing also will be determined using epifluorescence microscopy.

The selected surface is irradiated with 400-nm light (5 mW InGaN laser, Coherent Laser Group). The surface is examined (using AFM and FTIR) for azide reduction or, specifically, imine-formation in the immediate vicinity of adsorbed particles. (Although the imine likely would be hydrolyzed, or may not even form, under aqueous solution, it may be generated upon dehydration of the surface after photocatalytic reduction of the azide.) Aqueous-phase derivatization of amines on the surface with a fluorophore (e.g., fluorescein isothiocyanate) identify the extent of photocatalytic azide reduction. A control is run in the absence of surface adsorbed CdS nanoparticles. This work demonstrates that the photocatalytic chemistry carried out in solution also occurs with surface-bound ligands and adsorbed CdS Qdots.

Imaging of electrophoretically mobile CdS nanoparticles: Particles are adsorbed onto the aryl azide-terminated surface and imaged before and after the imposition of an electric field. CdS Qdots are deposited at a given location on a modified gold surface in a low ionic strength solution (~1 mM) and covered with a microscope slide coverslip. Qdot movement across the surface in the presence and in the absence of an electric field is monitored by epifluorescence microscopy. At the target particle velocity of ~100 nm/s in an electric field, particle movement is resolvable in minutes.

The electrophoresis cell is machined from Teflon™ following a design used by Groves et al. to study the electrophoresis of proteins in supported lipid bilayers (see FIG. 1). (38) For particles of this size and with an estimated surface charge of 80+, the field strength necessary for a velocity, v, of ~100 nm/s in solution is ~1 mV/cm based on the following equation which results from a balance of the electrophoretic driving force with the drag force, $$-v = D\left(\frac{zF}{RT}\right)\frac{d\phi}{dz}.$$

D is the diffusivity (which can be estimated as $kT/3\pi\mu d$); z is the charge on the nanoparticle, F is Faraday's constant; $d\phi/dz$ is the electrical field; k is Boltzmann's constant, T is temperature, $\mu$ is the viscosity; and d is the particle diameter. The electrical field strength calculated using this equation is considered a minimum, as it does not take into account the substantial friction between the Qdot and the modified gold surface in the surface adsorbed case. Nevertheless, even at field strengths 3-4 orders of magnitude greater, energy dissipation is likely <10 μW which does not result in significant Joule heating. (38) This work demonstrates that the amine-terminated particles can be driven about the azide-terminated surface by an electric field, and provides information on the relationship between field strength and particle surface velocity (although the velocity could be impacted by the surface reaction) and on the relative importance of Brownian motion from random Qdot movement over a comparable time frame at zero field strength.

Surface photocatalytic azide reduction by electrophoretically mobile CdS nanoparticles: The 400-nm laser is used to illuminate moving particles to create trails of reacted azide on the surface. A simple re-orientation of the electric field can be attempted to re-direct the moving particles at a 90° angle, for example, to the initial trajectory; and the light source is shielded at controlled intervals to create "pen-ups" in the nanopattern. The reacted molecules are imaged using AFM in both topographical and frictional force modes. In the region of the CdS particle on the surface, reduction to the amine takes place. The amine could be derivatized with a more bulky group (e.g., the bulky green fluorophore, fluorescein isothiocyanate also could serve this purpose) for better imaging. Alternatively, if the surface is dehydrated, amines and aldehydes on neighboring molecules may react readily due to their proximity giving chains of surface-bound, electrically conducting polyarylimine "wires" (see FIG. 6 for polyarylimine formed by photocatalytic reduction of the surface adsorbed aromatic azidoaldehydes). In any case, the reduced portion of the surface, with or without derivatization or polymerization, is expected to show topographical and tactile (using AFM) properties distinct from those of the unreduced layer.

The continuity of the "lines" of reacted ligand as a function of field strength provides data concerning the maximum velocity of the particles for complete surface reaction. Also, the straightness of the trails provides some measure of the influence of Brownian motion and of the need to increase the friction between the particle and the surface. Surface friction may be adjusted through the surface chemistries of the particle and substrate, through solution conditions such as ionic strength, or through temperature, for example.

It should be recognized that there are a virtually unlimited variety of chemical systems suitable for application via the subject invention. Many other smooth substrates (other than gold and silicon containing materials) are available as are a broad variety of catalytic particles (the process need not limited to photocatalysis) and reactive organic ligands. In addition, one could imagine force fields other than electrical to move appropriate particles (e.g., magnetic and the like). Techniques with silicon (see immediately below) have been developed to produce very smooth surfaces of large area for microelectronics applications. (17)

Self-Assembled Monolayers on Silicon: High-quality, self-assembled monolayers have been prepared recently on silicon surfaces by hydrosylation of terminal alkenes, by reaction of alkyl lithium and Grignard reagents with chlorine terminated surfaces, and by silylation of OH-terminated silicon (see Schemes 4A and 4B below).

Scheme 4A:
Formation of SAMs on Silicon (Si—C Surfaces)

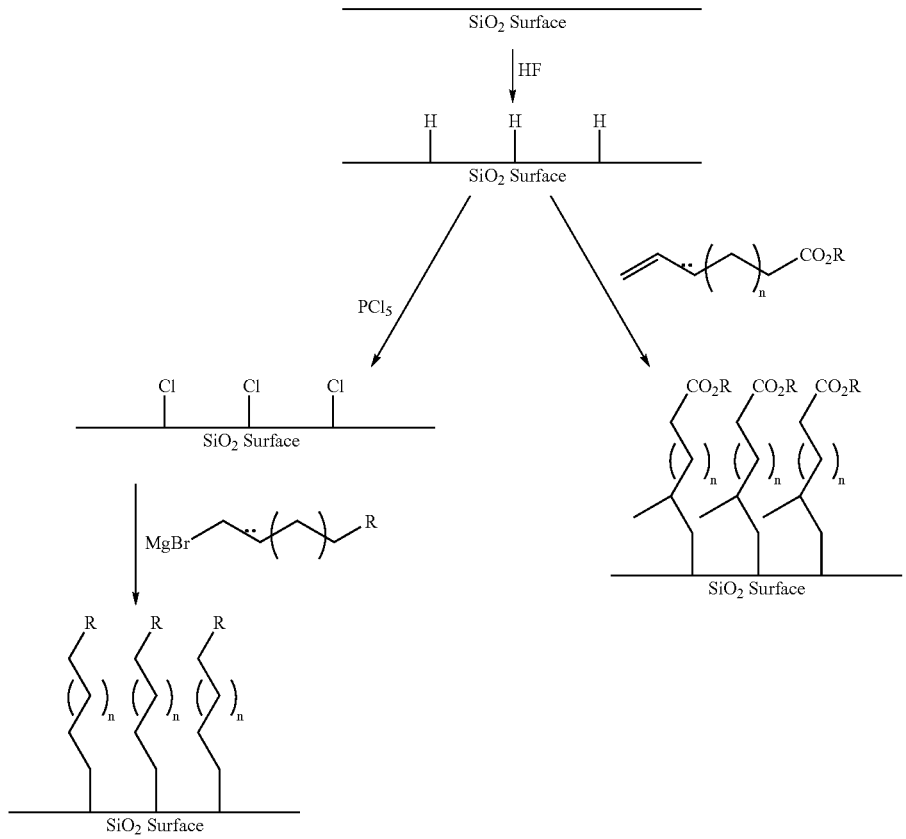

Scheme 4B:
Formation of SAMs on Silicon (Si—O—SiR Surfaces)

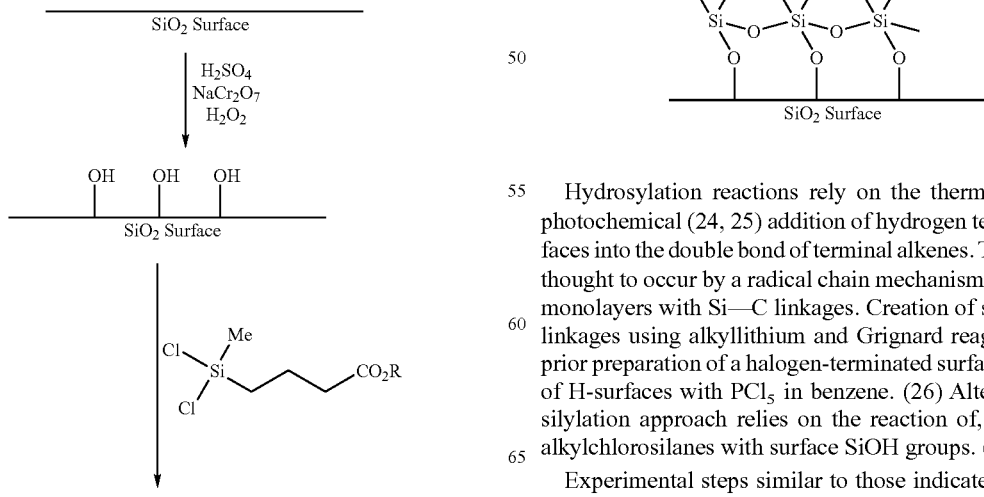

Hydrosylation reactions rely on the thermal (20-23) or photochemical (24, 25) addition of hydrogen terminated surfaces into the double bond of terminal alkenes. The reaction is thought to occur by a radical chain mechanism and produces monolayers with Si—C linkages. Creation of surface Si—C linkages using alkyllithium and Grignard reagents requires prior preparation of a halogen-terminated surface by reaction of H-surfaces with $PCl_5$ in benzene. (26) Alternatively, the silylation approach relies on the reaction of, for example, alkylchlorosilanes with surface SiOH groups. (26, 28)

Experimental steps similar to those indicated will be followed with the new substrate chemistries beginning with an analysis of the photocatalytic reaction in solution followed by the work with the Qdots on the modified substrate surface.

Photocatalytically Reactive SAMs on Silicon: From a relatively large number of photocatalyzed processes that can be used to pattern a self-assembled monolayer three relatively simple systems are studied. Si—C and Si—O—SiR functionalized surfaces will have fundamentally different properties when exposed to irradiated Qdots.

Photosensitized reactions of varying types will change the properties of the exposed surface. These include the photodecarboxylation of carboxylic acids, the photodenitrogenation and Wolff rearrangement of diazoketones, and the photoreduction of aromatic nitrocompounds. Most of these processes can be readily investigated with commercially or readily available compounds to prepare the derivatized monolayers.

Photodecarboxylation Reactions: The photosensitized decarboxylation of organic acids (39, 40) is a well-known photosensitized reaction that proceeds in good chemical yields. An electron must be transferred from the catalyst surface to the carboxy group to produce a radical anion. Radical anions from neutral acids and their salts can rapidly decarboxylate to give an alkyl radical in the chain along with a molecule of $CO_2$, and a hydrogen atom in the case of the neutral acid. The decarboxylation will occur in the proximity of the electrophoretically mobile CdS Qdots leaving a hydrophobic nano-trail of chemically robust hydrocarbon chains on an otherwise hydrophilic and readily derivatizable acid surface (see FIG. 7). Monolayers will be prepared by the methods outlined above on Si—C and Si—O—SiR surfaces with several readily accessible carboxylic acid derivatives.

Since the rates and efficiencies of decarboxylation can be affected by substituents attached to the carbon next to the carboxylic acid group (α-substituents), (41, 42) a series of long chain ω-unsaturated acids and esters will be made (see Scheme 5) with and without radical stabilizing substituents in the α-position. Surfaces are prepared by alkene hydrosylation and by functionalization of surface silanols with ω-chlorosilanes.

Scheme 5

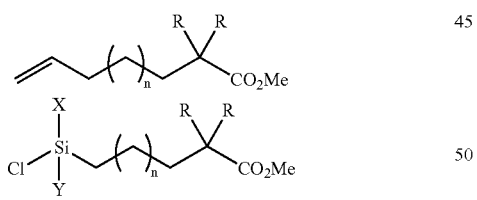

n = 6, 8, 10, 12
R = H, Me and Ph
X, Y = Me, Cl

Photodenitrogenation and Wolff Rearrangement of Diazoketones: The photodenitrogenation and Wolff rearrangement of α-diazoketones is arguably the most important organic chemical reaction of the 20th century. (43-45) The Wolff rearrangement (see Scheme 6) is the critical chemical process behind the transformation of diazonaphthoquinone into indanecarboxylic acid within Novolak matrices. A change in solubility in the polymer matrix upon changing from the neutral diazoquinone to the carboxylic, caused by irradiation of the former through a mask, constitutes the most used microlithographic system in the world and the chemistry behind the information age revolution.

Scheme 6

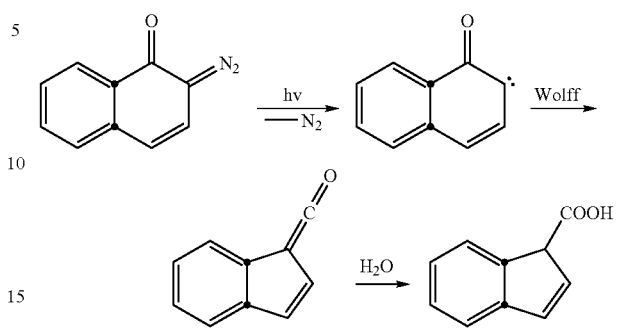

Photosensitized and directly irradiated diazo ketones have a remarkable ability to lose molecular nitrogen and generate highly reactive ketocarbene intermediates. Within fractions of a nanosecond, the ketocarbene can undergo a Wolff rearrangement to generate a ketene (see Scheme 7). The ketene thus formed can rapidly trap water to form a carboxylic acid.

Scheme 7

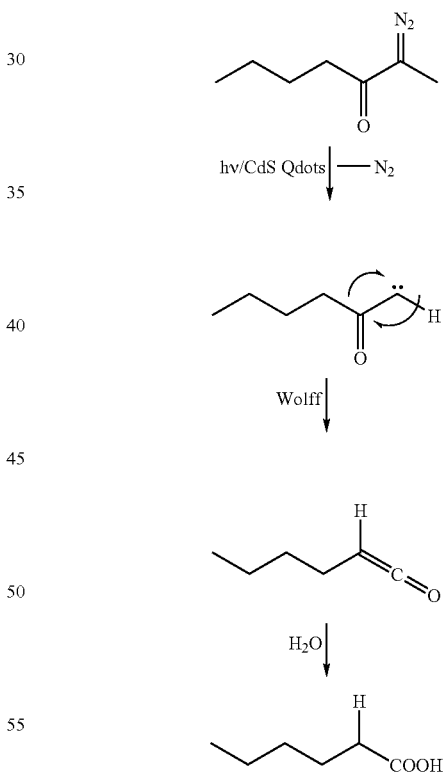

Given the sensitivity of diazoketones to high temperature conditions, organic substrates needed for the preparation of diazoketone-terminated, self-assembled-monolayers will require the use of mild silylation procedures. The silylation of OH terminated surfaces will require the preparation of ω-chloro-, ω-dichloro- and ω-trichlorosylane-diazoketone chains (see Scheme 8 for exemplary precursor synthesis and FIG. 8).

Scheme 8

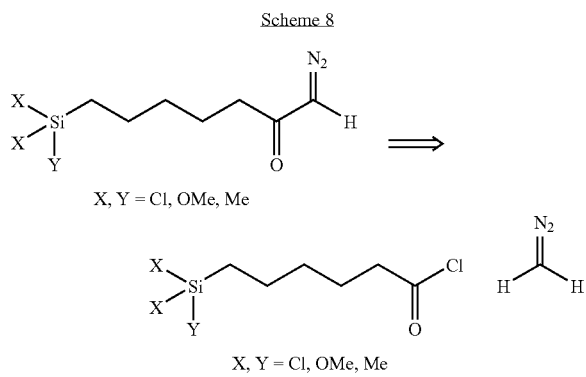

Condensation of Aromatic Diamines by Photocatalyzed Reduction of Diazides and Dinitro Compounds: The formation of surface patterns based on conducting organic polymers is highly desirable for the construction of nanoscale circuitry. Based on the organic chemistry and photocatalytic systems developed, the preparation of polymers based on the condensation of amines and aldehydes to yield polyimines is greatly advantageous. While there was some preliminary success in the catalyzed condensation of para-amino aldehydes, it has also been noted that they do not undergo a very efficient polymerization in solution without significant thermal activation or the use of relatively strong catalysts. The relative stability of the 4-aminoaldehydes towards self-coupling and condensation reactions results from their electronic structure and is not totally unexpected: while the para-amino group renders the aldehyde less electrophilic, the aldehyde group reduces the nucleophilicity of the amine. Nevertheless, the close proximity of photocatalytically reduced azides and aldehyde groups of neighboring molecules on the surface should result in ready polymerization upon dehydration of the surface.

An additional, relatively simple experiment to test the likelihood of forming a conducting polymer from the developed CdS nanoparticle technology is shown below. In order to establish the feasibility of preparing surface-imprinted polyimine-based conducting polymers, the cross-condensation reactions between 1,4-diamines with terephthalaldeydes is investigated. The main appeal of this reaction lies in the simplicity of the starting materials and on the high reactivity of diamines and dialdehydes. The preparation of cross-linked single crystals of amine residue-containing enzymes by diffusion of dialdehydes in aqueous media and at room temperature is an impressive demonstration of the potential of this reaction.(46) The diamine modified surfaces can be prepared by the photocatalyzed reduction of 1,4-diazides, as described above, and from the well known photoreduction of nitrocompounds under the subject photocatalytic conditions. A variety of substrates are commercially available and several closely related examples of amines and aldehydes have been shown to participate in the formation of aromatic azomethine polymers.(29) The physical properties of the polymer resulting from test substrates will be tested to verify if they are similar to those derived from the polymers isolated from subject synthesized monomers. The desired polymerization is achieved in the bulk by mixing the constituents under various conditions including the use of anhydrous and aqueous solvents, and in the presence of a dehydrating agents or dilute acid. The resulting products is characterized by standard methods to examine their conductive properties.

Diazides and dinitro compounds can be photo-reduced in solution with the aid of CdS (or CdSe) nanoparticles (see Scheme 9), upon which the di-aldehyde substrate can be added to initiate polymerization. This will help us understand the polymerization on the surface and will help us fine-tune the conditions that will optimize it.

Scheme 9

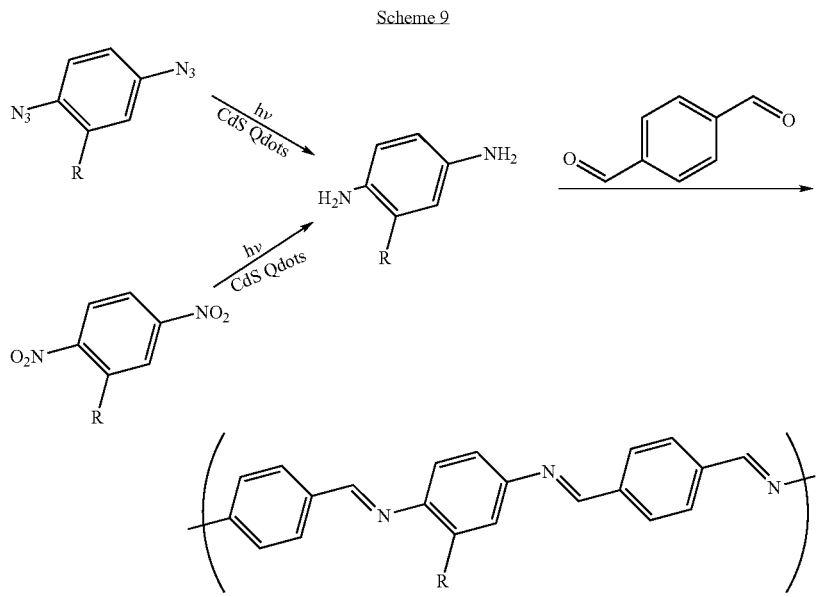

Nanopattern Drawing: In order for complex patterns to be drawn, the electric field direction (and strength, perhaps) must be re-oriented in a pre-programmed way so as to direct the photocatalytic Qdots, which serve as the "pens", about the surface. "Pen-ups" can be introduced into the pattern by intermittently shielding the light source with a programmed shutter (see FIG. 2). Re-orientation of the electric field can be accomplished either by rotating the surface in a constant plane (see FIG. 2), by moving the electrodes about in the surface plane, or by transient charging of pairs of electrodes in an array surrounding the substrate. The latter approach likely will prove most elegant and practical because it will not entail moving parts and will not generate fluid flow as the rapid movement of the substrate or of a single pair of electrodes would. If the field strength is kept constant, then the particle motion should remain constant and programming the drawing of a pattern composed of line segments becomes a rather straightforward problem of reorienting the field vector for the prescribed lengths of time necessary to produce line segments of desired length and orientation. The drawing of curves requires that the field direction be varied constantly. This problem becomes more tractable when viewed as the drawing of arcs of known radius. The field orientation then is varied over the corresponding angle for the time necessary to draw the arc of the desired length given the constant motion of the Qdots. The reproducibility of patterns drawn simultaneously by many particles on a surface will be determined by comparing AFM images of the patterns generated by individual Qdots. It is expected that there will be some heterogeneity due to surface defects and to the small spread in particle size (~5% standard deviation about the mean).

Experimental Results

Preparation of quantum dots, Qdots: CdS or CdSe Qdots are prepared in standard ways. For example, amine-thiol capped CdS Qdots were prepared by mixing $CdCl_2$ (0.15 mM), $HSCH_2CH_2NH_3{}^+Cl^-$ (4.9 mM), and $Na_2S$ (0.76 mM). A similar process was utilized for CdSe Qdots. Absorption/emission spectra for CdS Qdots (16 Å) and for CdSe Qdots (19 Å) have been obtained and are shown in FIG. 9. The amine-thiol capped Qdots were in the size range of 15-25 Å.

Figure 4B:
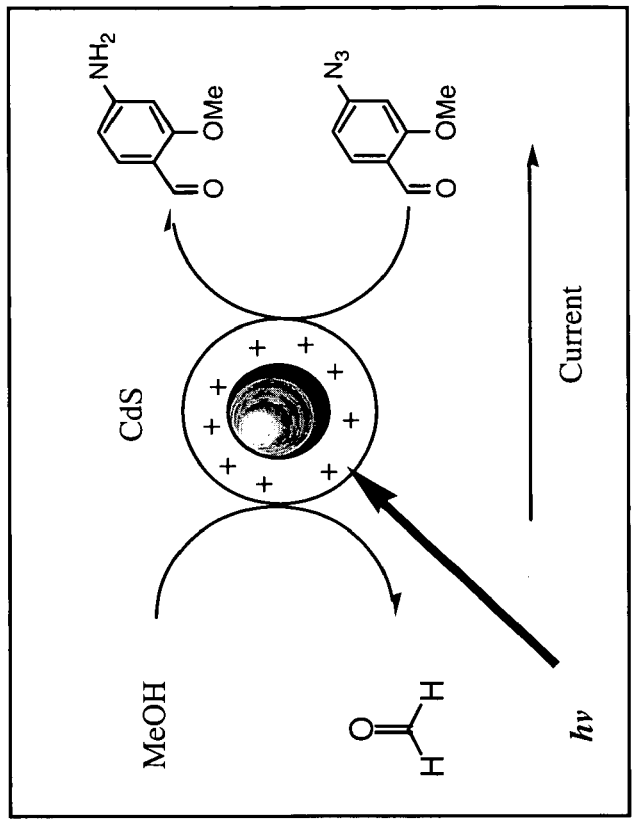
FIG. 4B is a schematic representation of photocatalyzed azide reduction with methanol as the electron donor.
Figure 4A:
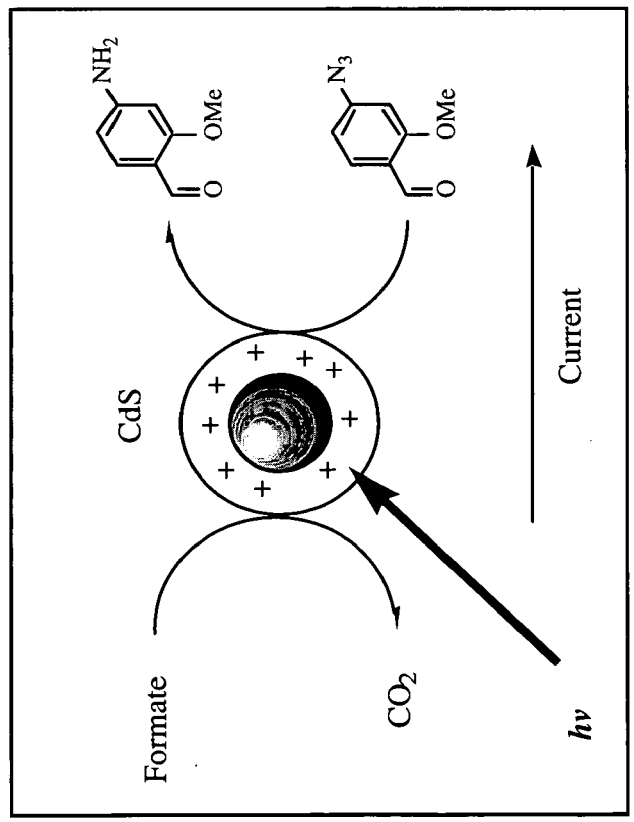
FIG. 4A is a schematic representation of photocatalyzed azide reduction with formate as the electron donor.

Photocatalytic reduction of various aromatic azides to amines have been carried out by CdS Qdots using a suitable electron donor (see FIGS. 4A and 4B and related information above). The azides studied include the following:

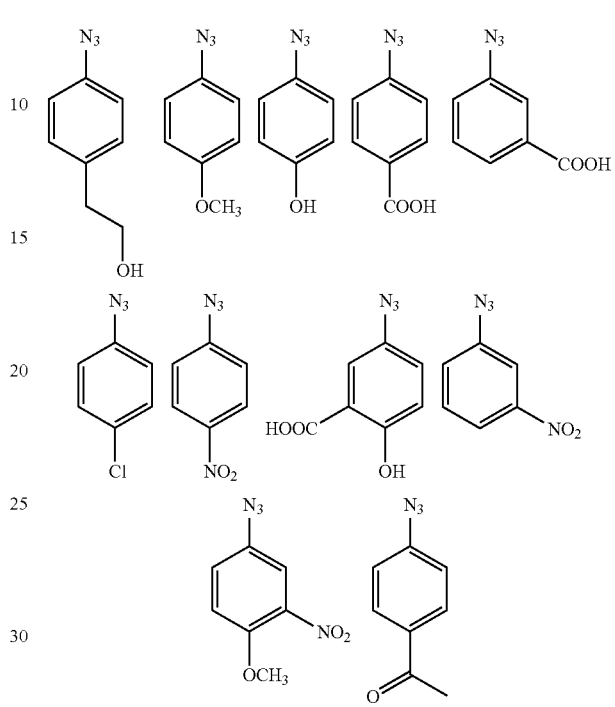

The exemplary synthesis of a SAM precursor using an aromatic azide was conducted according to the pathway shown below:

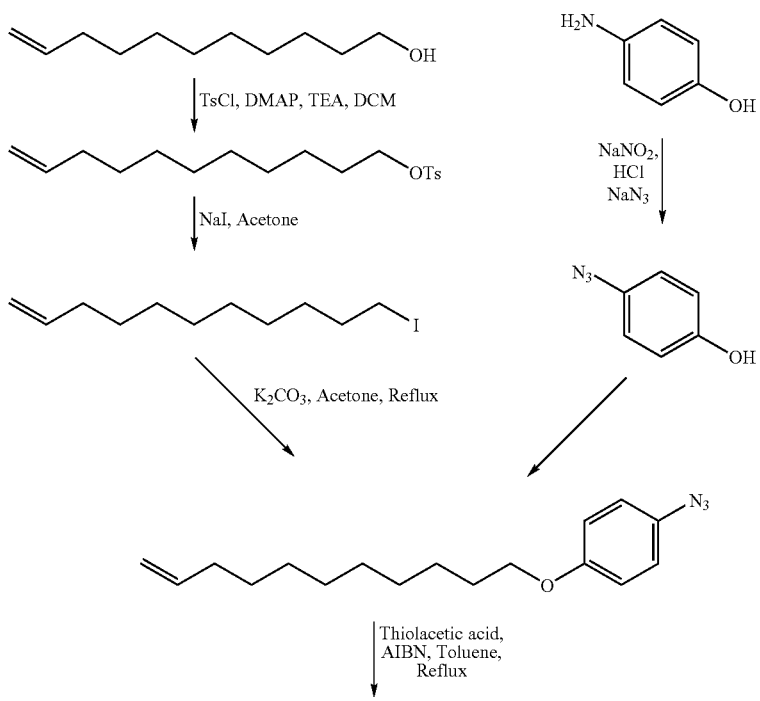

-continued

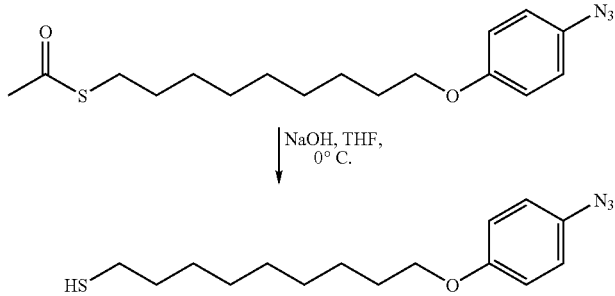

Exemplary SAMs were produced by depositing a 500 Å gold layer on a Si wafer with 50 Å of a Cr adhesive layer and then immersed for 24 hours in a freshly prepared benzene solution of 0.5 mM SAM precursor. Two SAMs produced in this manner are shown in FIGS. 10A and 10B. Both of these SAMS have been shown to be reduced to amines by either amine-thiol capped (positively charged) CdS Qdots or amine-thiol capped (positively charged) CdSe Qdots when exposed to light, usually light that is of a wavelength equal to or greater than 400 nm. FIG. 11 shows the decrease in azide peak after exposure to light (photoreduction).

An exemplary method for spotting the pattern on the surface of a SAM was achieved by staining the photoreduced amine groups with an appropriate fluorescence detectable dye, FITC (see immediately below and FIG. 12), but it is stressed that other detection methods for induced chemical reactions is also contemplated.

imaging of the migrated Qdots (FIG. 13 depicts Qdots with increasing concentration from left to right).

As seen in FIG. 14, Qdots (specifically CdSe Qdots) do adsorb to an $SiO_2$ deposited (LPCVD) Si surface. The confocal microscopy image shows the distributed presence of Qdots adsorbed over the $SiO_2$.

The migration of Qdots over a smooth $SiO_2$ surface has been shown by surface electrophoresis (visualized with confocal microscopy). FIG. 15 shows an AFM image of a 5×5 μm $SiO_2$ surface over which Qdots have migrated in an electric field with pH=6.0, electric filed=6 V/cm, a mobility=$1.0 \times 10^3$ μm$^2$/Vs and utilizing copper electrodes (for FIG. 15: Surface=$SiO_2$, distance=1.22 μm, RMS=82.6 Å, and Average=65.0 Å). The lesser mobility of adsorbed Qdots on the $SiO_2$ surface is attributed to surface effects arising from surface roughness.

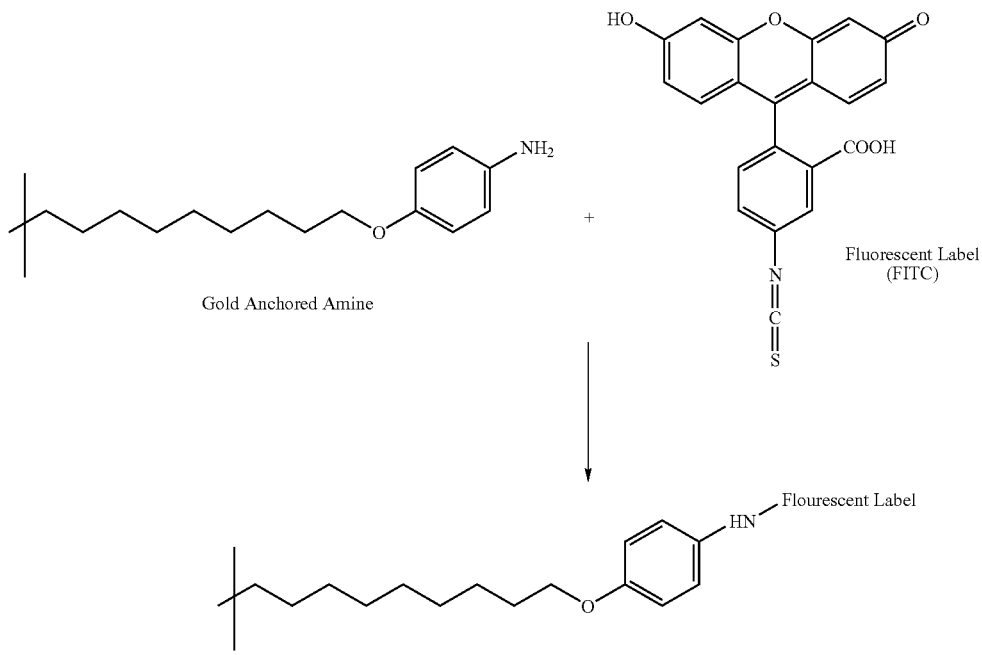

FIG. 13 provides evidence that Qdots, in this case amine-thiol capped CdSe Qdots, do migrate under an electrophoretic charge. Standard gel electrophoresis was conducted with CdSe Qdots at pH=5.0 and an electric field of 3 V/cm. A mobility of $4.6 \times 10^4$ μm$^2$/Vs was noted with fluorescence Again, in proof of the reduction to practice for the subject invention it is stressed that many experimental results, as stated above, have been achieved, including, but not limited to: 1) the photocatalytic reduction of an aryl azide-terminated self-assembled monolayer (SAM) on gold by adsorbed CdS or CdSe Qdots was shown to occur; 2) alternate aryl azide chemistries have been investigated and photocatalytic reduction by CdS or CdSe Qdots have been confirmed; 3) fluorescence tagging of aryl amines generated by photoreduction of the corresponding azides has been demonstrated; 4) atomically smooth SAMs were formed on evaporated gold films and characterized by AFM; 5) CdS and CdSe Qdots were adsorbed on a SAM and imaged by epifluorescence microscopy; 6) an electrochemical cell for electrophoretic movement of Qdots on SAMs with simultaneous monitoring by confocal epifluorescence microscopy has been constructed and tested; and 7) controlled electrophoretic movement of CdSe Qdots on Si/SiO$_2$ surfaces has been achieved and observed using confocal epifluorescence microscopy.

REFERENCES

Each document cited below is herein incorporated by reference into the subject specification.

1. Goldhaber-Gordon, D.; Montemerlo, M. S.; Love, J. C.; Opiteck, G. J.; Ellenbogen, J. C. Overview of Nanoelectronic Devices. *Proc. IEEE* 1997, 85, 521-540.
2. Fox, M. A. Fundamentals in the Design of Molecular Electronic Devices: Long-Range Charge Carrier Transport and Electronic Coupling. *Acc. Chem. Res.* 1999, 32, 201-207.
3. Ellenbogen, J. C.; Love, J. C. *Architectures for molecular electronic computers: 1. Logic structures and an adder built from molecular electronic diodes*. Mitre: McLean, Va., 1999.
4. Collier, C. P.; Wong, E. W.; Belohradsky, M.; Raymo, F. M.; Stoddart, J. F.; Kuekes, P. J.; Williams, R. S.; Heath, J. R. Electronically Configurable Molecular-Based Logic Gates. *Science* 1999, 285, 391-394.
5. Chen, J; Reed, M. A.; Rawlett, A. M.; Tour, J. M. Large On-Off Ratios and Negative Differential Resistance in a Molecular Electronic Device. *Science* 1999, 286, 1550-1552.
6. Heath, J. R.; Kuekes, P. J.; Snider, G. S.; Williams, R. S. A Defect-Tolerant Computer Architecture: Opportunities for Nanotechnology. *Science* 1998, 280, 1716-1721.
7. Johnson, K. S.; Thywissen, J. H.; Dekker, N. H.; Berggren, K. K.; Chu, A. P.; Younkin, R.; Prentiss, M. Localization of Metastable Atom Beams with Optical Standing Waves: Nanolithography at the Heisenberg Limit. *Science* 1998, 280, 1583-1586.
8. Eigler, D. M.; Schweitzer, E. K. Positioning single atoms with scanning tunnelling microscope. *Nature* 1990, 344, 524-526.
9. Chey, S. J.; Huang, L.; Weaver, J. H. Manipulation and writing with Ag nanocrystals on Si(111)-7×7. *Appl. Phys. Lett* 1998, 72, 2698-2700.
10. Cox, J. K.; Eisenberg, A.; Lennox, R. B. Patterned surfaces via self-assembly. *Curr Opinion Coll. Interface Sci.* 1999, 4, 52-59.
11. Manoharan, H. C.; Lutz, C. P.; Eigler, D. M. Quantum mirages formed by coherent projection of electronic structure. *Nature* 2000, 403, 512-515.
12. Katsikas, L.; Velickovic, J. S.; Weller, H.; Popovic, I. G. Thermogravimetric Characterisation of Poly(Methyl Methacrylate) Photopolymerised by Colloidal Cadmium Sulfide. *J. Therm. Anal.* 1997, 49, 317-323.
13. Korgel, B. A.; Monbouquette, H. G. Quantum Confinement Effects Enable Photocatalyzed Nitrate Reduction at Neutral pH Using CdS Nanocrystals. *J. Phys. Chem. B* 1997, 101, 5010-5017.
14. Eychmüller, A.; Katsikas, L.; Weller, H. Photochemistry of Semiconductor Colloids. 35. Size Separation of Colloidal CdS by Gel Electrophoresis. *Langmuir* 1990, 6, 1605-1608.
15. Israelachvili, J. *Intermolecular and Surface Forces*, 2$^{nd}$ Ed. Academic Press: San Diego, 1992; pp.50-54.
16. Stamou, D.; Gourdon, D.; Liley, M.; Burnham, N. A.; Kulik, A.; Vogel, H.; Duschl, C. Uniformly Flat Gold Surfaces: Imaging the Domain Structure of Organic Monolayers Using Scanning Force Microscopy. *Langmuir* 1997, 13, 2425-2428.
17. Yasutake, M.; Wakiyama, S.; Kato, Y. Measurement of Si wafer and SiO$_2$ layer microroughness by large sample atomic force microscope. *J. Vac. Sci. Technol. B* 1994, 12, 1572-1576.
18. Porter, M. D.; Bright, T. B.; Allara, D. L.; Chidsey, C. E. D. Spontaneously organized molecular assemblies. 4. Structural characterization of n-alkyl thiol monolayers on gold by optical ellipsometry, infrared spectroscopy, and electrochemistry. *J. Am. Chem. Soc.* 1987, 109, 3559-3568.
19. Alves, C. A.; Smith, E. L.; Porter, M. D. Atomic Scale Imaging of Alkanethiolate Monolayers at Gold Surfaces with Atomic Force Microscopy. *J. Am. Chem. Soc.* 1992, 114, 1222-1227.
20. Cicero, R. L.; Wagner, P.; Linford, M. R.; Hawker, C. J.; Waymouth, R. M.; Chidsey, C. E. D., Functionalization of Alkyl Monolayers on Surfaces with Diverse Amines: Photochemical Chlorosulfonation Followed by Sulfonamide Formation. *Polym. Prepr.* 1997, 38, 904-905.
21. Sieval, A. B.; Demirel, A. L.; Nissink, J. W. M.; Linford, M. R.; van der Maas, J. H.; de Jeu, W. H.; Zuilhof, H.; Sudholter, E. J. R., Highly Stable Si—C Linked Functionalized Monolayers on the Silicon (100) Surfaces *Langmuir* 1998, 14, 1759-1678.
22. Sieval, A. B.; Vleeming, V.; Zuilhof, H.; Sudholter, E. J. R., An Improved Method for the Preparation of Organic Monolayers of 1-Alkenes on Hydrogen-Terminated Silicon Surfaces *Langmuir* 1999, 15, 8288-8291.
23. Linford, M. R.; Chidsey, C. E. D., Alkyl Monolayers Covalently Bound to Silicon Surfaces *J. Am. Chem. Soc.* 1993, 115, 12631-12632.
24. Boukherroub, R.; Wayner, D. D. M., Controlled Functionalization and Multistep Chemical Manipulation of Covalently Modified Si(111) Surfaces *J. Am. Chem. Soc.* 1999, 121, 11513-11515.
25. Boukherroub, R.; Morin, S.; Benzebaa, F.; Wayner, D. D. M., New Synthetic Routes to Alkyl Monolayers on the Si(111) Surface *Langmuir* 1999, 15, 3831-3835.
26. Bansal, A.; Li, X.; Lauermann, I.; Lewis, N. S.; Yi, S.; Weinberg, W. H., Alkylation of Si Surfaces Using a Two-Step Halogenation/Grignard Route *J. Am. Chem. Soc.* 1996, 118, 7225-7226.
27. Kluth, G. J.; Sung, M. M.; Maboudian, R., Thermal Behavior of Alkylsiloxane Self-Assembled Monolayers on the Oxidized Si(000) Surface *Langmuir* 1997, 13, 3775-3780.
28. Fadeev, A. Y.; McCarthy, T. J., Trialkylsilane Monolayers Covalently Attached to Silicon Surfaces: Wettability Studies Indicating that Molecular Topography Contributes to Contact Angle Histeresis. *Langmuir* 1999, 15, 3759-3766.
29. Morgan, P. W.; Kwolek, S. L.; Pletcher, T. C. Aromatic Azomethine Polymers and Fibers. *Macromolecules* 1987, 20, 729-739.
30. Wagner, P.; Hegner, M.; Guntherodt, H. J.; Semenza, G. Formation and in situ modification of monolayers chemisorbed on ultraflat template-stripped gold surfaces. *Langmuir* 1995, 11, 3867-3875.

31. Kinnear, K. T.; Monbouquette, H. G. Direct Electron Transfer to *Escherichia coli* Fumarate Reductase in Self-Assembled Alkanethiol Monolayers on Gold Electrodes. *Langmuir* 1993, 9, 2255-2257.
32. Kinnear, K. T.; Monbouquette, H. G. An Amperometric Fructose Biosensor Based on Fructose Dehydrogenase Immobilized in a Membrane Mimetic Layer on Gold. *Anal. Chem.* 1997, 69, 1771-1775.
33. Reipa, V.; Yeh, S.-M. L.; Monbouquette H. G.; Vilker, V. L. Orientation of Tetradecylmethylviologen on Gold and Its Mediation of Electron Transfer to Nitrate Reductase. *Langmuir*, 1999, 15, 8126-8132.
34. Korgel, B. A.; Monbouquette, H. G. Synthesis of Size-Monodisperse CdS Nanocrystals Using Phosphatidylcholine Vesicles as True Reaction Compartments. *J. Phys. Chem.* 1996, 180, 346-351.
35. Korgel, B. A.; Monbouquette, H. G. Controlled Synthesis of Mixed Core and Layered (Zn,Cd)S and (Hg,Cd)S Nanocrystals within Phosphatidylcholine Vesicles. *Langmuir*, in press
36. Colvin, V. L.; Goldstein, A. N.; Alivisatos, A. P. Semiconductor Nanocrystals Covalently Bound to Metal Surfaces with Self-Assembled Monolayers. *J. Am. Chem. Soc.* 1992, 114, 5221-5230.
37. Nosaka, Y.; Ohta, N.; Fukuyama, T.; Fujii, N. Size Control of Ultrasmall CdS Particles in Aqueous Solution by Using Various Thiols. *J. Colloid Interface Sci.* 1993, 155, 23-29.
38. Groves, J. T.; Wülfing, C.; Boxer, S. G. Electrical Manipulation of Glycan-Phosphatidyl Inositol-Tethered Proteins in Planar Supported Bilayers. *Biophys. J.*, 1996, 71, 2716-2723.
39. Bard, A. J.; Kraeutler, B. Photocatalytic Decarboxylation of Saturated Carboxylic Acids. U.S. Pat. No. 4,303,486 A 19811201 1981.
40. Wan, P.; Budac, D. In *Photodecarboxylation of Acids and Lactones*; W. M. Horspool and P.-S. Song, Ed.; CRC Press: Boca Raton, 1995; pp 384-392.
41. Wan, P.; Budac, D. In *CRC Handbook of Organic Photochemistry and Photobiology*; W. M. Horspool and P.-S. Song, Ed.; CRC Press: Boca Raton, 1995; pp 384-392.
42. Budac, D.; Wan, P. Photodecarboxylation—mechanism and synthetic utility. *J. Photochem. Photobiol., A* 1992, 67,135-166.
43. Rosenfeld, A.; Mitzner, R.; Baumbach, B.; Bendig, J., Laser Photolytic and Low Temperature Investigations of Naphthoquinone Diazides in Novolak Films *J. Photochem. Photobiol. A: Chem.* 1990, 55, 259-268.
44. Reichmanis, E.; Thompson, L. F., Polymer Materials for Microlithography *Chem. Rev.* 1989, 89, 1273-1289.
45. Nalamasu, O.; Baiocchi, F. A.; Taylor, G. N. In *Photooxidation of Polymers*. ACS: Washington, D.C., 1989; pp 189.
46. Khalaf, N.; Govardhan, C. P.; Lalonde, J. J.; Persichetti, R. A.; Wang, Y. F.; Margolin, A. L. Cross-linked enzyme crystals as highly active catalysts in organic solvents. *J. Am. Chem. Soc.* 1996, 118, 5494-5495.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited, by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A method of producing a surface nanopattern comprising the steps:
   a) obtaining a substrate with a smooth surface;
   b) acquiring a self-assembling monolayer precursor, wherein said precursor includes an inducible active region and a substrate attachment region;
   c) mixing a plurality of said self-assembling monolayer precursors with said substrate to produce a self-assembled monolayer having an exposed surface comprising said inducible active regions and anchored to said substrate smooth surface by said substrate attachment regions;
   d) obtaining a path-directable nanoparticle;
   e) contacting said path-directable nanoparticle with said exposed surface at an interface area;
   f) exposing said exposed surface contacted with said path-directable nanoparticle to an inducing event thereby altering said inducible active regions and producing a detectable state at said interface area on said exposed surface; and
   g) applying a force to said contacted path-directable nanoparticle to produce movement of said nanoparticle over said exposed surface thereby extending said detectable state interface area into a detectable trace over said exposed surface to produce the nanopatterned surface.

2. A method of producing a surface nanopattern according to claim 1, wherein said inducible active region comprises a photocatalytically active region.

3. A method of producing a surface nanopattern according to claim 2, wherein each said photocatalytically active region is selected from a group consisting of an azide moiety, a carboxylic acid moiety, a diazoketone moiety, and an aromatic nitro-containing moiety.

4. A method of producing a surface nanopattern according to claim 1, wherein said path-directable nanoparticle comprises a charged nanoparticle.

5. A method of producing a surface nanopattern according to claim 4, wherein said charged nanoparticle is selected from a group consisting of CdS compounds and CdSe compounds.

6. A method of producing a surface nanopattern according to claim 4, wherein said charged nanoparticle is selected from a group consisting of protonated amine CdS compounds and protonated amine CdSe compounds.

7. A method of producing a surface nanopattern according to claim 1, wherein said smooth surface is present on a material selected from a group consisting of gold and a silicon containing compound.

8. A method of producing a surface nanopattern according to claim 1, wherein said self-assembling monolayer precursor is an organic compound.

9. A method of producing a surface nanopattern according to claim 1, wherein each said substrate attachment region comprises a terminal attachment species and a plurality of methylenes.

10. A method of producing a surface nanopattern according to claim 9, wherein said terminal attachment species is selected from a group consisting of an unsaturated moiety and a sulfur containing moiety.

11. A method of producing a surface nanopattern according to claim 1, wherein said inducible alteration of said inducible active regions is a photocatalytic alteration and is selected from a group consisting of photoreduction of an azide, photodecarbozylation of a carboxylic acid, photodenitrogenation and Wolff rearrangement of a diazoketone, and the photoreduction of an aromatic nitrocompound.

12. A method of producing a surface nanopattern according to claim 1, wherein said applied force is a user-directed electrophoretic field of variable strength and direction.

13. A method of producing a surface nanopattern according to claim 1, wherein said detectable state is selected from a group consisting of an amine generated by the photoreduction of an azide, a methyl generated by the photodecarboxylation of a carboxylic acid, a carboxylic acid generated by the photodenitrogenation and Wolff rearrangement of a diazoketone, and an amine generated by the photoreduction of an aromatic nitrocompound.

14. A method of producing a surface nanopattern comprising the steps:
 a) obtaining a substrate with a smooth surface;
 b) acquiring a self-assembling monolayer precursor, wherein said precursor includes a photocatalytically active region and a substrate attachment region;
 c) mixing a plurality of said self-assembling monolayer precursors with said substrate to produce a self-assembled monolayer having an exposed surface comprising said photocatalytically active regions and anchored to said substrate smooth surface by said substrate attachment regions;
 d) obtaining a photocatalytic charged nanoparticle;
 e) contacting said photocatalytic charged nanoparticle with said exposed surface at an interface area;
 f) exposing said exposed surface contacted with said photocatalytic charged nanoparticle to light thereby altering said photocatalytically active regions and producing a detectable state at said interface area on said exposed surface; and
 g) applying a force to said contacted photocatalytically charged nanoparticle to produce movement of said nanoparticle over said exposed surface thereby extending said detectable state interface area into a detectable trace over said exposed surface to produce the nanopatterned surface.

15. A method of producing a surface nanopattern according to claim 14, wherein said smooth surface is atomically smooth.

16. A method of producing a surface nanopattern according to claim 15, wherein said atomically smooth surface is present on a material selected from a group consisting of gold and a silicon containing compound.

17. A method of producing a surface nanopattern according to claim 14, wherein said self-assembling monolayer precursor is an organic compound.

18. A method of producing a surface nanopattern according to claim 14, wherein each said photocatalytically active region is selected from a group consisting of an azide moiety, a carboxylic acid moiety, a diazoketone moiety, and an aromatic nitro-containing moiety.

19. A method of producing a surface nanopattern according to claim 14, wherein each said substrate attachment region comprises a terminal attachment species and a plurality of methylenes.

20. A method of producing a surface nanopattern according to claim 19, wherein said terminal attachment species is selected from a group consisting of an unsaturated moiety and a sulfur containing moiety.

21. A method of producing a surface nanopattern according to claim 14, wherein said photocatalytic charged nanoparticle is selected from a group consisting of CdS compounds and CdSe compounds.

22. A method of producing a surface nanopattern according to claim 14, wherein said photocatalytic charged nanoparticle is selected from a group consisting of protonated amine CdS compounds and protonated amine CdSe compounds.

23. A method of producing a surface nanopattern according to claim 14, wherein said altering of said photocatalytically active regions comprises photocatalytic alteration and wherein said photocatalytic alteration is selected from a group consisting of photoreduction of an azide, photodecarbozylation of a carboxylic acid, photodenitrogenation and Wolff rearrangement of a diazoketone, and the photoreduction of an aromatic nitrocompound.

24. A method of producing a surface nanopattern according to claim 14, wherein said applied force is a user-directed electrophoretic field of variable strength and direction.

25. A method of producing a surface nanopattern according to claim 14, wherein said detectable state is selected from a group consisting of an amine generated by the photoreduction of an azide, a methyl generated by the photodecarboxylation of a carboxylic acid, a carboxylic acid generated by the photodenitrogenation and Wolff rearrangement of a diazoketone, and an amine generated by the photoreduction of an aromatic nitrocompound.

26. A method of producing a surface nanopattern comprising the steps:
 a) obtaining a substrate with an atomically smooth surface;
 b) acquiring a self-assembling monolayer precursor, wherein said precursor includes a photocatalytically active region and a substrate attachment region;
 c) mixing a plurality of said self-assembling monolayer precursors with said substrate to produce a self-assembled monolayer having an exposed surface comprising said photocatalytically active regions and anchored to said substrate smooth surface by said substrate attachment regions;
 d) obtaining a photocatalytic charged nanoparticle;
 e) contacting said photocatalytic charged nanoparticle with said exposed surface at an interface area;
 f) exposing said exposed surface contacted with said photocatalytic charged nanoparticle to light thereby photocatalytically altering said photocatalytically active regions and producing a detectable state at said interface area on said exposed surface; and
 g) applying a user-directed electrophoretic field of variable strength and direction to said contacted photocatalytic charged nanoparticle to produce movement of said photocatalytic contacted nanoparticle over said exposed surface thereby extending said detectable state interface area into a detectable trace over said exposed surface to produce the nanopatterened surface.

27. A method of producing a surface nanopattern according to claim 26, wherein said atomically smooth surface is present on a material selected from a group consisting of gold and a silicon containing compound.

28. A method of producing a surface nanopattern according to claim 26, wherein said self-assembling monolayer precursor is an organic compound.

29. A method of producing a surface nanopattern according to claim 26, wherein each said photocatalytically active region is selected from a group consisting of an azide moiety, a carboxylic acid moiety, a diazoketone moiety, and an aromatic nitro-containing moiety.

30. A method of producing a surface nanopattern according to claim 26, wherein each said substrate attachment region comprises a terminal attachment species and a plurality of methylenes.

31. A method of producing a surface nanopattern according to claim 30, wherein said terminal attachment species is selected from a group consisting of an unsaturated moiety and a sulfur containing moiety.

32. A method of producing a surface nanopattern according to claim 26, wherein said photocatalytic charged nanoparticle is selected from a group consisting of CdS compounds and CdSe compounds.

33. A method of producing a surface nanopattern according to claim 26, wherein said photocatalytic charged nanoparticle is selected from a group consisting of protonated amine CdS compounds and protonated amine CdSe compounds.

34. A method of producing a surface nanopattern according to claim 26, wherein said photocatalytic alteration is selected from a group consisting of photoreduction of an azide, photodecarbozylation of a carboxylic acid, photodenitrogenation and Wolff rearrangement of a diazoketone, and the photoreduction of an aromatic nitrocompound.

35. A method of producing a surface nanopattern comprising the steps:
   a) obtaining a substrate with an atomically smooth surface;
   b) acquiring a self-assembling monolayer precursor, wherein said precursor includes a photocatalytically active region and a substrate attachment region;
   c) mixing a plurality of said self-assembling monolayer precursors with said substrate to produce a self-assembled monolayer having an exposed surface comprising said photocatalytically active regions and anchored to said substrate smooth surface by said substrate attachment regions;
   d) obtaining a plurality of photocatalytic charged nanoparticle;
   e) contacting said plurality of photocatalytic charged nanoparticle with said exposed surface at a plurality of interface areas;
   f) exposing said exposed surface contacted with said plurality of photocatalytic charged nanoparticle to light thereby photocatalytically altering said photocatalytically active regions and producing a detectable state for each said photocatalytically charged nanoparticle at said interface area on said exposed surface; and
   g) applying a user-directed electrophoretic field of variable strength and direction to said contacted plurality of photocatalytic charged nanoparticle to produce movement for each of said photocatalytic contacted nanoparticle over said exposed surface thereby extending each said detectable state interface area into a detectable trace over said exposed surface to produce a plurality of nanopatterns on said exposed surface.

36. A method of producing a surface nanopattern according to claim 35, wherein said atomically smooth surface is present on a material selected from a group consisting of gold and a silicon containing compound.

37. A method of producing a surface nanopattern according to claim 35, wherein said self-assembling monolayer precursor is an organic compound.

38. A method of producing a surface nanopattern according to claim 35, wherein each said photocatalytically active region is selected from a group consisting of an azide moiety, a carboxylic acid moiety, a diazoketone moiety, and an aromatic nitro-containing moiety.

39. A method of producing a surface nanopattern according to claim 35, wherein each said substrate attachment region comprises a terminal attachment species and a plurality of methylenes.

40. A method of producing a surface nanopattern according to claim 39, wherein said terminal attachment species is selected from a group consisting of an unsaturated moiety and a sulfur containing moiety.

41. A method of producing a surface nanopattern according to claim 35, wherein each said photocatalytic charged nanoparticle is selected from a group consisting of CdS compounds and CdSe compounds.

42. A method of producing a surface nanopattern according to claim 35, wherein each said photocatalytic charged nanoparticle is selected from a group consisting of protonated amine CdS compounds and protonated amine CdSe compounds.

43. A method of producing a surface nanopattern according to claim 35, wherein said photocatalytic alteration is selected from a group consisting of photoreduction of an azide, photodecarbozylation of a carboxylic acid, photodenitrogenation and Wolff rearrangement of a diazoketone, and the photoreduction of an aromatic nitrocompound.

* * * * *